(12) United States Patent  
Takahashi et al.

(10) Patent No.: US 7,313,860 B2
(45) Date of Patent: Jan. 1, 2008

(54) MOUNTING DEVICE

(75) Inventors: Toru Takahashi, Katano (JP); Makoto Fujikawa, Takarazuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 303 days.

(21) Appl. No.: 10/499,912

(22) PCT Filed: Dec. 27, 2002

(86) PCT No.: PCT/JP02/13752

§ 371 (c)(1),
(2), (4) Date: Jun. 22, 2004

(87) PCT Pub. No.: WO03/059033

PCT Pub. Date: Jul. 17, 2003

(65) Prior Publication Data

US 2005/0015972 A1    Jan. 27, 2005

(30) Foreign Application Priority Data

Dec. 28, 2001  (JP)  ............................. 2001-400137

(51) Int. Cl.
*H05K 13/04* (2006.01)
*B23P 21/00* (2006.01)
*G01L 3/10* (2006.01)

(52) U.S. Cl. ........................ 29/740; 29/593; 29/709; 29/714; 29/741; 29/743; 29/785; 29/792

(58) Field of Classification Search .................. 29/593, 29/709, 711, 714, 715, 739–743, 783–787, 29/791–795

See application file for complete search history.

(56) References Cited

U.S. PATENT DOCUMENTS

| 4,750,263 | A | | 6/1988 | Yagi et al. ................. 29/741 X |
| 5,172,469 | A | * | 12/1992 | Onda et al. .................... 29/762 |
| 6,513,233 | B1 | * | 2/2003 | Nakao et al. .................. 29/740 |

FOREIGN PATENT DOCUMENTS

| JP | 61-2397 | 1/1986 |
| JP | 63-292700 | 11/1988 |
| JP | 4-354197 | 12/1992 |
| JP | 06-307965 | 11/1994 |
| JP | 09-218226 | 8/1997 |
| JP | 10-51196 | 2/1998 |
| JP | 10-341587 | 12/1998 |
| JP | 11-187693 | 7/1999 |
| JP | 2000-31692 | 1/2000 |
| JP | 2000-340999 | 12/2000 |
| JP | 2000-354976 | 12/2000 |
| JP | 2001-024392 | 1/2001 |
| JP | 2001-036294 | 2/2001 |
| JP | 2001-336995 | 12/2001 |

* cited by examiner

*Primary Examiner*—Peter Vo
*Assistant Examiner*—Livius R. Cazan
(74) *Attorney, Agent, or Firm*—Wenderoth, Lind & Ponack, L.L.P.

(57) ABSTRACT

A mounting apparatus includes an X-Y table for holding a board onto which components are to be mounted, and drive units for moving a mounting section by which the components are to be mounted, and also moving individual sections. When an effective torque calculated by an effective torque detecting section is decided by an effective torque deciding section as having exceeded a specified upper-limit value, rotational speed of a corresponding one of the drive units is decreased.

22 Claims, 25 Drawing Sheets

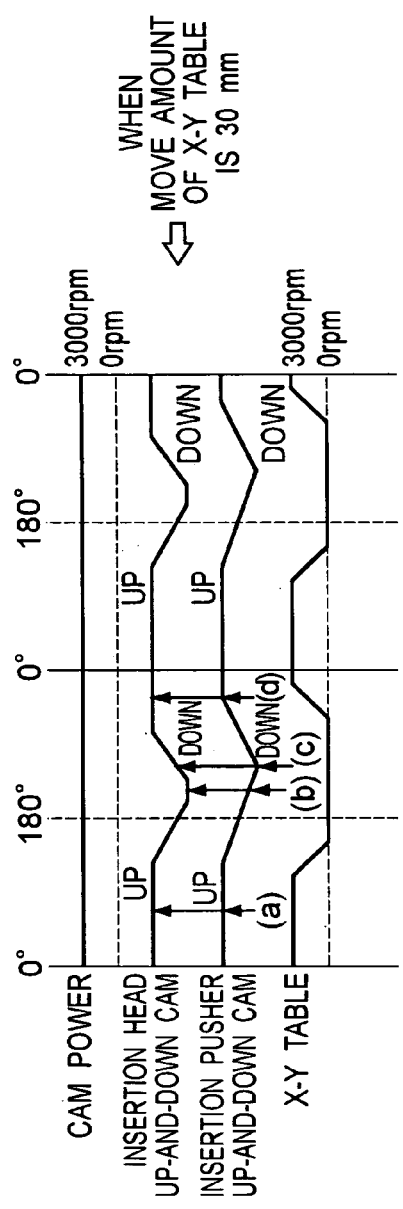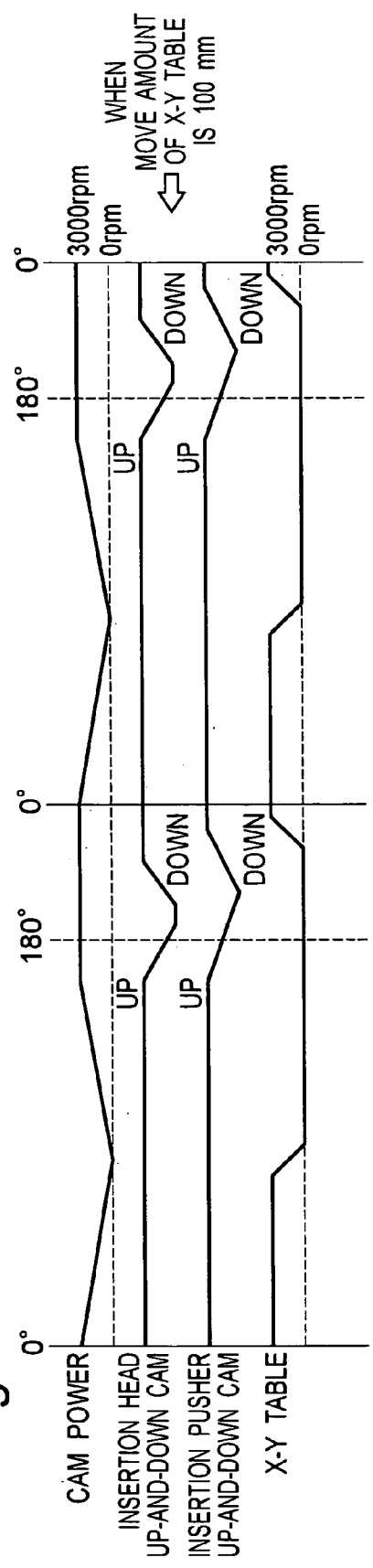

MOUNTING DEVICE

This application is a 371 of PCT/JP02/13752, filed Dec. 27, 2002.

TECHNICAL FIELD

The present invention relates to a mounting apparatus for mounting electronic components (hereinafter, referred to as components) onto a circuit board (hereinafter, referred to as board).

BACKGROUND ART

A mounting apparatus of this kind has conventionally had a construction in that it comprises: a feed section for feeding a specified type and quantity of electronic components; a board holding section for holding a circuit board, onto which those electronic components are to be mounted, and which is movable longitudinally and laterally; a mounting section for mounting those electronic components onto the circuit board; and a plurality of drive units for driving these individual sections.

That is, it has been a case that components fed from the feed section are mounted on and on appropriately in order.

In this conventional mounting apparatus, when an effective torque of a drive unit has exceeded a specified upper-limit value due to a mounting-apparatus operation mode or load variation, the drive unit would increase in temperature due to heat generation of internal parts, where continuing an operation as it is could result in a failure of the drive unit.

For prevention of this failure, in a case where an effective torque of a drive unit could exceed a specified upper-limit value, it has been practiced to select a large-capacity drive unit in which a safety factor, i.e. degree of margin, of a controllable drive unit capacity is set higher.

This would hitherto cause an excessive capacity selection of the drive unit to be involved in drive unit selection, further leading to an increase in mechanical cost.

Accordingly, an object of the present invention is to provide a mounting apparatus which is capable of suppressing temperature increases due to heat generation of components inside a drive unit caused by the drive unit's effective torque exceeding a specified upper-limit value, suppressing a safety factor, i.e. degree of margin, for selection of a drive unit to a lower one, and thus preventing failures of the drive unit even if the drive unit is as small in capacity as a minimum requirement, and low in price, and therefore, which makes it possible to perform high-efficiency production without halting the apparatus.

SUMMARY OF THE INVENTION

In order to achieve the above object, the present invention has the following constitution.

According to a first aspect of the present invention, there is provided a mounting apparatus comprising:

an electronic component feeding unit for feeding a plurality of electronic components;

a board holding section for holding a circuit board, onto which the electronic components are to be mounted, and being capable of moving the circuit board in two orthogonal directions along a mounting surface;

a mounting section for mounting electronic components fed from the electronic component feeding unit onto the circuit board held by the board holding section;

a plurality of drive units for driving the electronic component feeding unit, the board holding section, and the mounting section, respectively;

an effective torque detecting section for detecting an effective torque required by at least one drive unit from among the plurality of drive units at an effective-torque detection cycle;

an effective torque deciding section for deciding whether or not detected effective torque has exceeded its upper-limit value, or whether or not the effective torque has been restored from an excess state to its safety value;

a detection error eliminating means for deciding whether or not the effective torque detected by the effective torque detecting section is a detection error, before a decision made by the effective torque deciding section, to assign the effective torque, which has been decided as a non-detection error, to an object for a decision by the effective torque deciding section; and a control section for performing control of each of the electronic component feeding unit, the board holding section, the mounting section, the plurality of drive units, the effective torque detecting section, the effective torque deciding section, and the detection error eliminating means, wherein the control section performs a control operation so that if the detected effective torque has been decided by the detection error eliminating means as a non-detection error, and moreover decided by the effective torque deciding section as having exceeded the upper-limit value, then an original rotational speed of the drive unit from which the effective torque has been detected is decreased to a specified deceleration speed of a relevant drive unit, and if the effective torque of the drive unit detected by the effective torque detecting section has lowered to not more than its safety value, the drive unit is restored again to an original rotational speed.

That is, in the present invention, an effective torque required, for example, within a specified time by any one of a plurality of drive units is detected at a specified cycle or period by the effective torque detecting section, and it is decided by the effective torque deciding section whether or not the effective torque has exceeded a specified upper-limit value, wherein if the effective torque has exceeded the specified upper-limit value, then a rotational speed of the drive unit is decreased to a specified speed, and if the effective torque has lowered to a specified value or lower, the drive unit is restored to an original rotational speed. As a result of this, failures of the drive units can be prevented, and high-efficiency production can be fulfilled without halting the apparatus.

According to a second aspect of the present invention, there is provided the mounting apparatus according to the first aspect, wherein each of the electronic components is an electronic component having a lead wire.

According to a third aspect of the present invention, there is provided the mounting apparatus according to the first aspect, wherein the electronic component feeding unit comprises: an electronic component feed section for storing therein a multiplicity of electronic components and feeding the electronic components independently of one another; a plurality of conveyor members for taking out fed electronic components and conveying the electronic components to the mounting section; and a conveying section for moving the plurality of conveying members as the conveying members are arranged in a stringed annular shape.

According to a fourth aspect of the present invention, there is provided the mounting apparatus according to the first aspect, wherein the upper-limit value of the effective torque in the effective torque deciding section is set to 105% of a rated torque of the drive unit corresponding to a permissible number of successive overload operations in continuously performing an overload operation that the drive unit is decelerated, once halted and then immediately accelerated.

According to a fifth aspect of the present invention, there is provided the mounting apparatus according to the fourth aspect, wherein in the effective torque deciding section, the safety value of the effective torque that allows the drive unit to be restored to the original rotational speed is set to 95% of the rated torque of the drive unit.

According to a sixth aspect of the present invention, there is provided the mounting apparatus according to any one of the first to fourth aspects, wherein a detection period of the effective torque detecting section for detection of the effective torque required in a specified unit time of the drive unit is set to not more than 1 sec.

According to a seventh aspect of the present invention, there is provided the mounting apparatus according to the sixth aspect, wherein the control section performs control so that if the effective torque does not become lower than the specified upper-limit value even if the rotational speed of the drive unit is decreased, the drive unit is halted.

According to an eighth aspect of the present invention, there is provided the mounting apparatus according to the seventh aspect, wherein the drive unit comprises a servomotor and a drive control device for controlling drive of the servomotor.

According to a ninth aspect of the present invention, there is provided the mounting apparatus according to the seventh aspect, wherein the drive unit comprises a motor controlled by an inverter and a drive control device for controlling drive of the motor.

According to a tenth aspect of the present invention, there is provided the mounting apparatus according to the seventh aspect, wherein the drive unit comprises a stepping motor and a drive control device for controlling drive of the stepping motor.

According to an eleventh aspect of the present invention, there is provided the mounting apparatus according to the seventh aspect, wherein a time constant of the detection error eliminating means is set to 100 sec.

According to a twelfth aspect of the present invention, there is provided the mounting apparatus according to the seventh aspect, further comprising an input section by which a set value of the deceleration speed for the rotational speed of the drive unit in the deceleration operation can be inputted from external of the mounting apparatus.

According to a thirteenth aspect of the present invention, there is provided the mounting apparatus according to the twelfth aspect, wherein the input section is an operation panel.

According to a fourteenth aspect of the present invention, there is provided the mounting apparatus according to the twelfth aspect, wherein the input section is a floppy disk drive.

According to a fifteenth aspect of the present invention, there is provided the mounting apparatus according to the twelfth aspect, wherein the input section is an interface which allows data to be inputted from a higher-order computer.

According to a sixteenth aspect of the present invention, there is provided the mounting apparatus according to the first aspect, wherein if the effective torque detected by the effective torque detecting section is decided by the effective torque deciding section as having exceeded the upper-limit value, then the detection error eliminating means decides that the effective torque detected by the effective torque detecting section is a non-detection error only when the same decision result has succeeded to a specified number of times, and the detection error eliminating means decides that the effective torque detected by the effective torque detecting section is a detection error, and neglects the effective torque, when the same decision result does not succeed to the specified number of times.

According to a seventeenth aspect of the present invention, there is provided the mounting apparatus according to the first or sixteenth aspect, wherein if the effective torque detected by the effective torque detecting section is decided by the effective torque deciding section as being not more than the upper-limit value, then the detection error eliminating means decides that the effective torque detected by the effective torque detecting section is a non-detection error only when the same decision result has succeeded to a specified number of times, and the detection error eliminating means decides that the effective torque detected by the effective torque detecting section is a detection error, and neglects the effective torque, when the same decision result does not succeed to the specified number of times.

BRIEF DESCRIPTION OF DRAWINGS

These and other aspects and features of the present invention will become clear from the following description taken in conjunction with the preferred embodiments thereof with reference to the accompanying drawings, in which:

FIGS. 5A and 5B are timing charts, respectively, of the mounting apparatus of the first embodiment of the present invention;

DETAILED DESCRIPTION OF THE PREFERRED EMBODIMENTS

Figure 1:
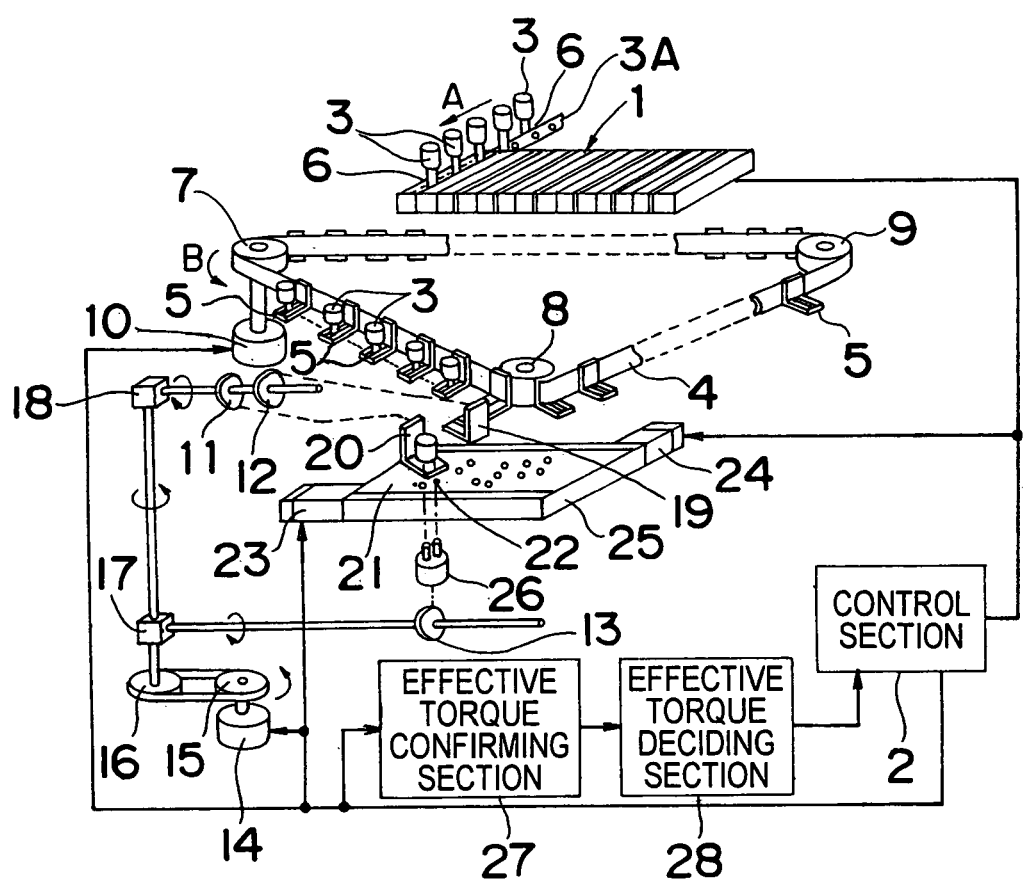
FIG. 1 is a block diagram of a mounting apparatus according to a first embodiment of the present invention.

Before description of the present invention proceeds, it is to be noted that like parts are designated by like reference numerals throughout the accompanying drawings.

Hereinbelow, a first embodiment of the present invention is described in detail with reference to the accompanying drawings.

(First Embodiment)

A mounting apparatus of the first embodiment of the present invention is explained below with reference to the accompanying drawings.

As shown in FIG. 1, under control by a control section 2, electronic components 3 are fed in a direction of arrow A by an electronic component feed section 1, in which a multiplicity of electronic components are stored in a linear array and which is capable of feeding the electronic components independently of one another, and then a plurality of conveyor members 5 arranged in a stringed annular shape on a belt 4, as an example of the electronic component feed section, are made to hold the components 3. The components 3 are fed in a state that the components 3 are fitted to a paper tape 3A or the like, and the electronic component feed section 1 also has a function of cutting the paper tape to separate the electronic components 3 into individual pieces. This electronic component feed section 1 and the conveyor members 5 constitute an example of an electronic component feeding unit.

Figure 9:
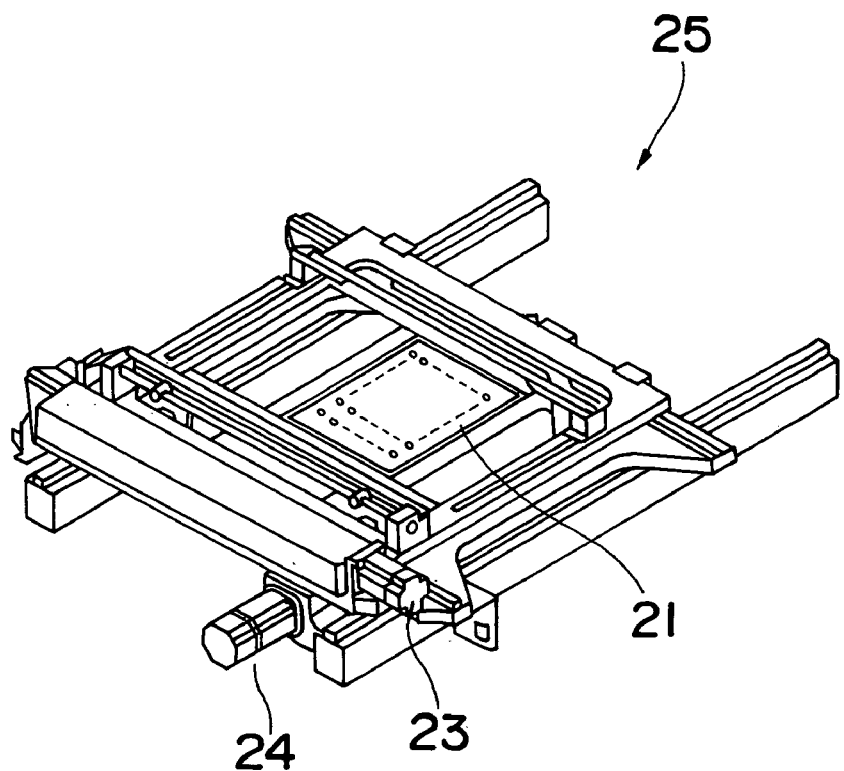
FIG. 9 is a perspective view of the X-Y table as an example of a board holding section of the mounting apparatus of the first embodiment of the present invention.

A conveyor member 5 is so designed that a pair of chucks are opened and closed to hold a plurality of lead wires 6 of the component 3. Belt 4 is stretched via pulleys 7, 8, 9 so as to form a generally triangular shape, and the conveyor members 5 are fitted to this belt 4 at equal intervals. By instructions of the control section 2, the belt 4 is turned normally in a direction of arrow B by a belt drive unit 10 composed of a motor and a motor driver or the like that is a drive control device for the motor, and rotating cams 11, 12, 13 are intermittently rotated via pulleys 15, 16 and power transmission units 17, 18, such as gear mechanisms, by a rotating-cam drive unit 14 composed of a motor and a motor driver or the like that is a drive control device for the motor, wherein each rotation of the rotating cams causes the conveyor members 5 to move by one conveyor-member shift. When a component 3 held by each conveyor member 5 has come to a position where the component is to be transferred from the conveyor member 5 to a transfer unit 19, the transfer unit 19 grasps the plurality of lead wires 6 of the component 3 held by the conveyor member 5, wherein the conveyor member 5 is opened, and the transfer unit 19 transfers the plurality of lead wires 6 of the component 3 to a mounting section 20. This sequence of operations is performed by making use of a driving force based on rotational operation of the rotating cam 12. The mounting section 20 performs steps of: holding the plurality of lead wires 6 of the component 3; moving down; inserting the plurality of lead wires 6 into a plurality of insertion holes 22 of a board 21, respectively; releasing the plurality of lead wires 6; and moving up, thus the component 3 being mounted on the board 21. This sequence of operations is performed by making use of a driving force based on rotational operation of the rotating cam 11. This board 21 is held by an X-Y table 25 as shown in FIG. 9, which is an example of a board holding section and which is capable of moving circuit board 21 in X-Y directions that are two directions orthogonal to each other and extending along a mounting surface of the circuit board 21. Further, the circuit board 21 is positioned by an X-direction drive unit 23 which is composed of a motor and a motor driver or the like that is a drive control device for the motor and which drives and controls X-direction movement of the board, as well as by a Y-direction drive unit 24 which is composed of a motor and a motor driver or the like that is a drive control device for this motor and which drives and controls Y-direction movement of the board, by virtue of the X-Y table 25. It is noted that a lead-wire support member (anvil mechanism) 26, which is located below the plurality of insertion holes 22 provided in the board 21, is moved up and down so as to receive the plurality of lead wires 6 of the component 3, and then performs cutting of the plurality of lead wires 6 and clinching of the plurality of lead wires 6 with the board 21, thus mounting of the component 3 onto the board 21 being completed, wherein up-and-down movement of the lead-wire support member 26 is effected by the rotating cam 13. These rotating cams 11, 12, 13 are rotated by the rotating-cam drive unit 14. That is, motive power of this rotating-cam drive unit 14 is transmitted to the pulleys 15, 16, and thereafter respective rotating cams 11, 12, 13 are rotationally driven via the power transmission units 17, 18.

In addition, the drive units 10, 23, 24 are so designed as to intermittently operate when located at certain predetermined rotational positions, i.e. rotational angles, of the rotating cams 11, 12, 13 connected to the drive unit 14 via a mechanical mechanism.

This is an example of a process for mounting the component 3 onto the board 21.

Now described in detail is a component insertion operation, as well as a mechanism therefor, which is performed by making use of a driving force based on a rotational operation of the rotating cam 11 that is rotated by the rotating-cam drive unit 14.

Figure 17:
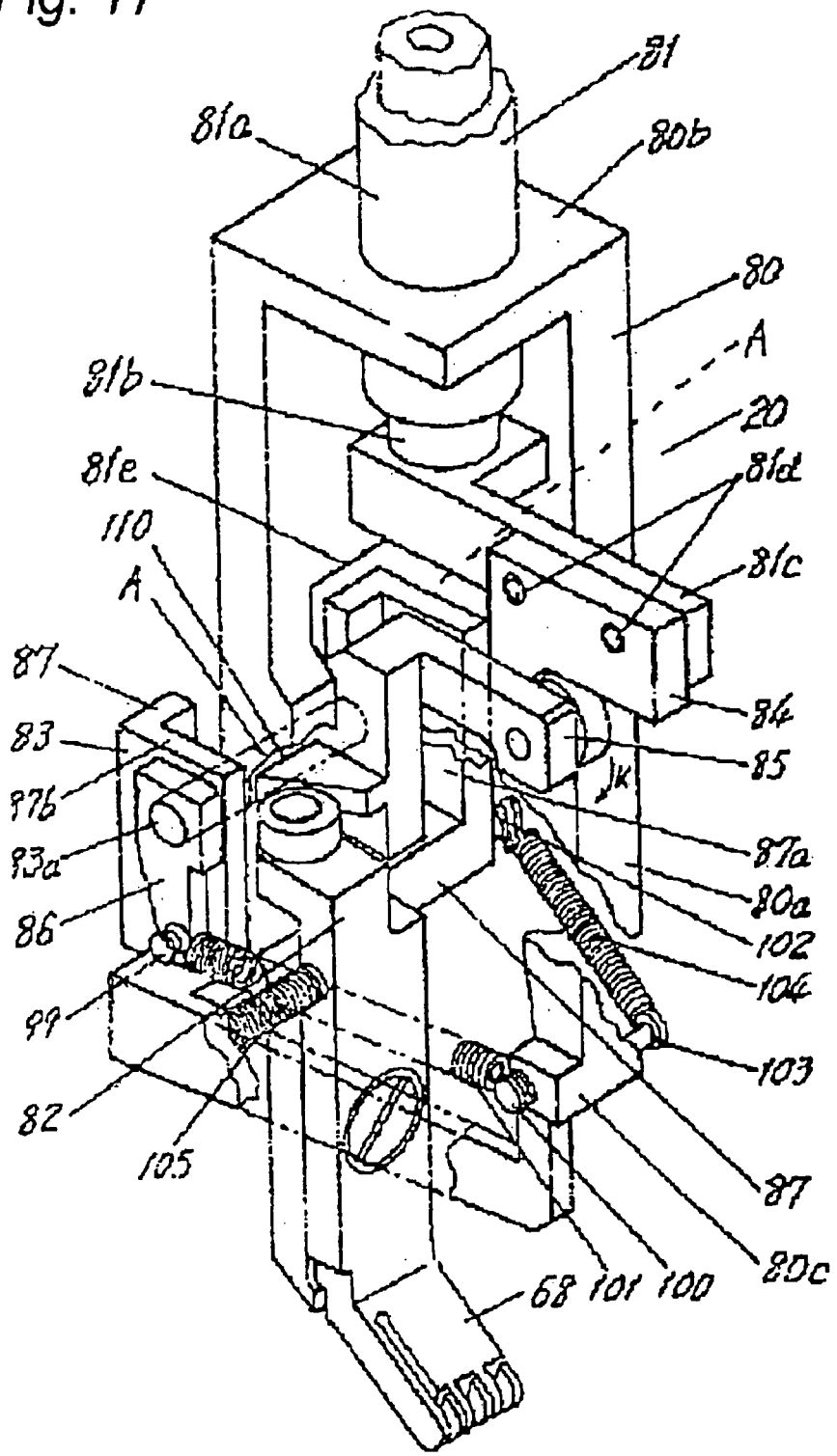
FIG. 17 is a perspective view of a mounting section of the mounting apparatus of the first embodiment of the present invention.

FIG. 17 shows the mounting section (mounting head) 20. This mounting section 20 includes: a head body 80 having an L-shaped-in-cross-section side wall 80a and a top face 80b; an up-down moving unit 81 for the head body 80; an insertion claw 68 provided in a lower portion of the head body 80; an opening/closing unit 82 for the insertion claw 68; and a pivoting unit 83 for movement in back and forth directions of the insertion claw 68, wherein a cam plate 84 forming the pivoting unit 83 is removably fitted to the head body 80. The up-down moving unit 81 is constituted of an outer shaft 81a fitted to the top face 80b of the head body 80, and the cam plate 84 is removably fitted by virtue of a screw 81d to a fitting portion 81c fitted to a lower portion of a core shaft 81b which is provided within the outer shaft 81a to transmit rotational power of the rotating cam 11.

Figure 18:
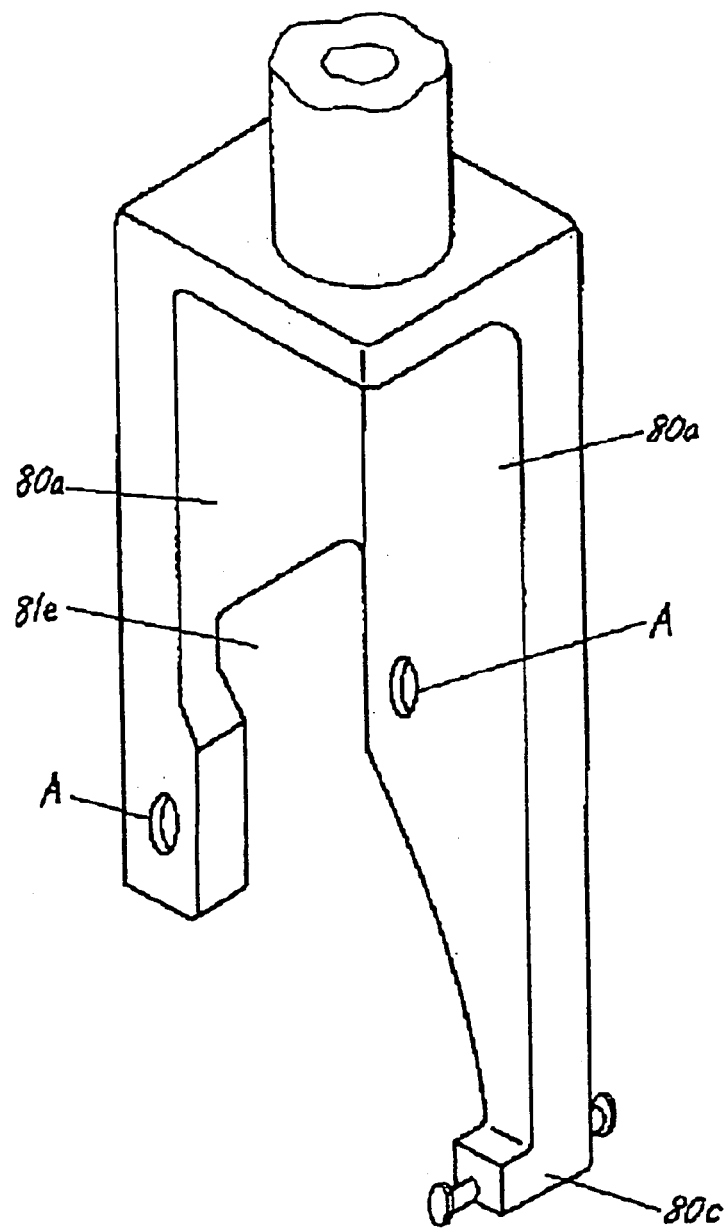
FIG. 18 is a perspective view of a head body of the mounting section of the mounting apparatus of the first embodiment of the present invention.

Next, the pivoting unit 83 is constructed as follows. This pivoting unit 83, as shown in FIGS. 17 and 18, has a pivot shaft 83a pivotally held at two through holes A provided in the side wall 80a of the head body 80.

Figure 20:
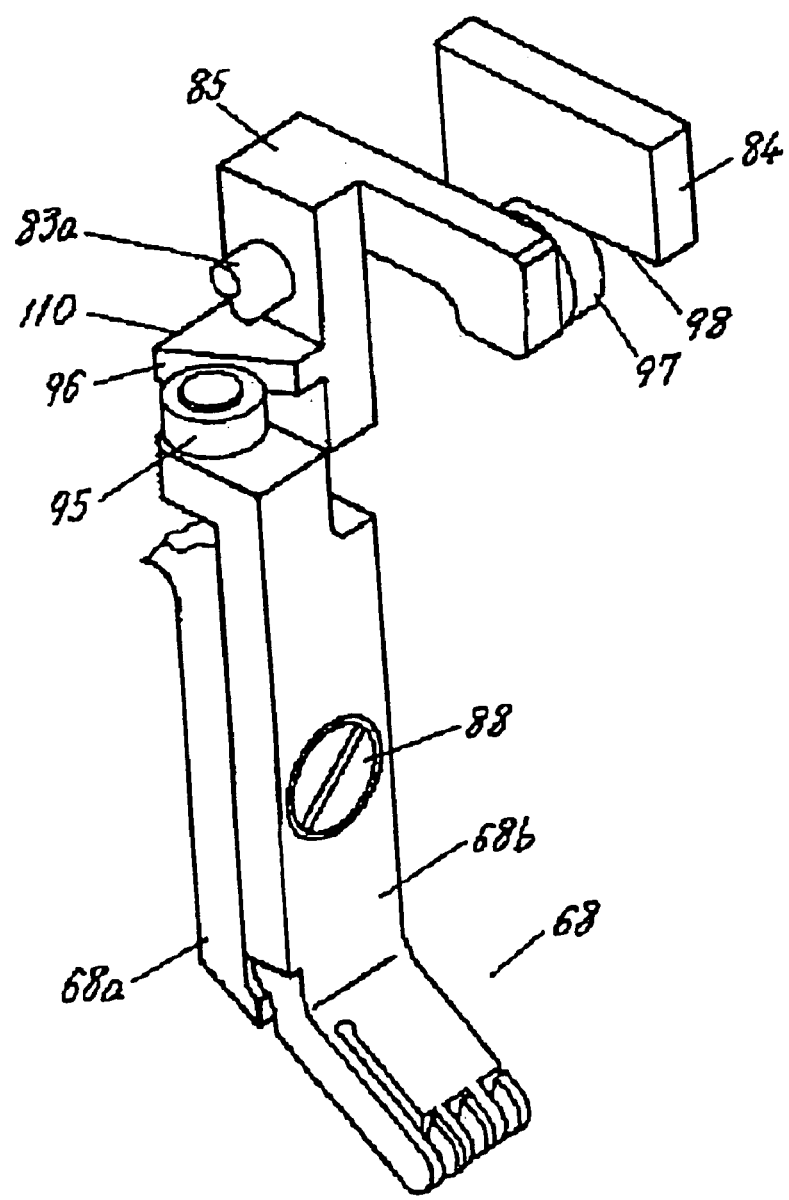
FIG. 20 is a perspective view of an insertion claw of the mounting section of the mounting apparatus of the first embodiment of the present invention.

On a right-side portion of this pivot shaft 83a in FIG. 17, an opening/closing lever 85, which is an example of a drive lever shown also in FIG. 20, is fixedly integrated, while a spring lever 86 of FIG. 17 is fixedly integrated on a left-end side.

Further, rearward of this opening/closing lever 85 is provided a U-shaped pivot member 87. A right side wall 87a on a right side of this pivot member 87 passes through an opening 81e of the side wall 80a of the head body 80 so as to plunge toward head body 80 side as shown in FIG. 17, while a left side wall 87b protrudes forward outside the head body 80, in which state the right-and-left side walls 80b, 80a are pivotably held to the pivot shaft 83a by through holes B.

Figure 19:
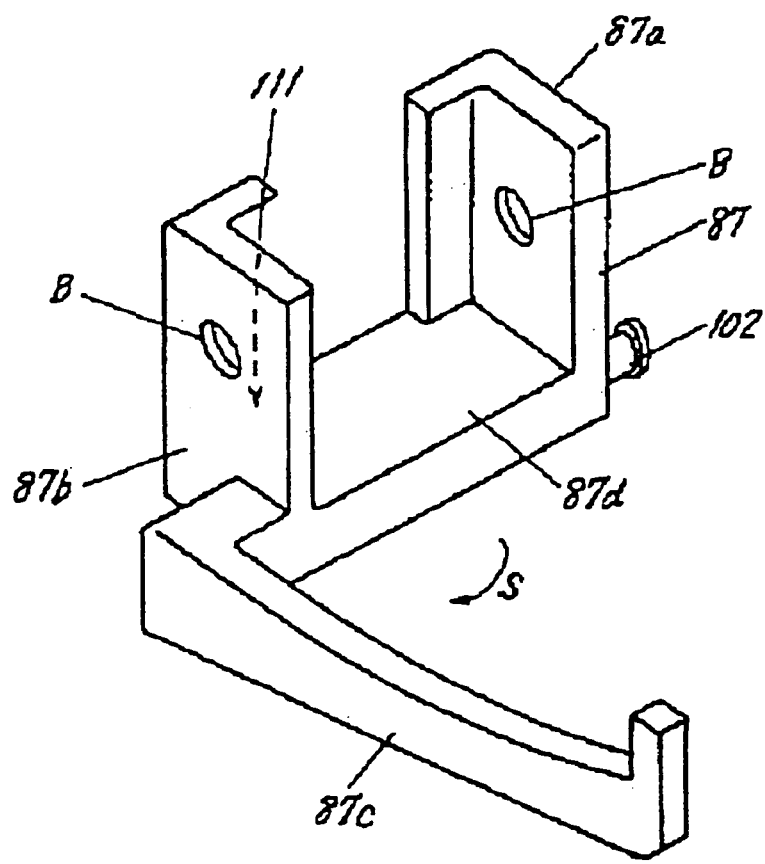
FIG. 19 is a perspective view of a rotating member of the mounting section of the mounting apparatus of the first embodiment of the present invention.

Also, the pivot member 87 has a lever 87c that protrudes forward from outside of the side wall 87b as shown in FIG. 19, and a tip end of the lever 87c makes contact with a lower-end contact portion 80c of the head body 80, by which the pivot member 87 is prevented from pivoting forward further (more than a state of FIG. 17).

Furthermore, an upper end of a first insertion claw 68a is fixed to a bottom wall 87d of the pivot member 87 by virtue of an unshown fixture as shown in FIGS. 17 and 20.

Also, the first insertion claw 68a and a second insertion claw 68b overlap each other, while a middle portion of the second insertion claw 68b is pivotally held to a middle portion of the first insertion claw 68a by a pin 88. By overlapping the first, second insertion claws 68a, 68b with each other, structure can be made more compact, and additionally, higher positional accuracy between the first, second insertion claws 68a, 68b can be obtained more easily, thereby allowing higher reliability of operation to be obtained.

Figure 21:
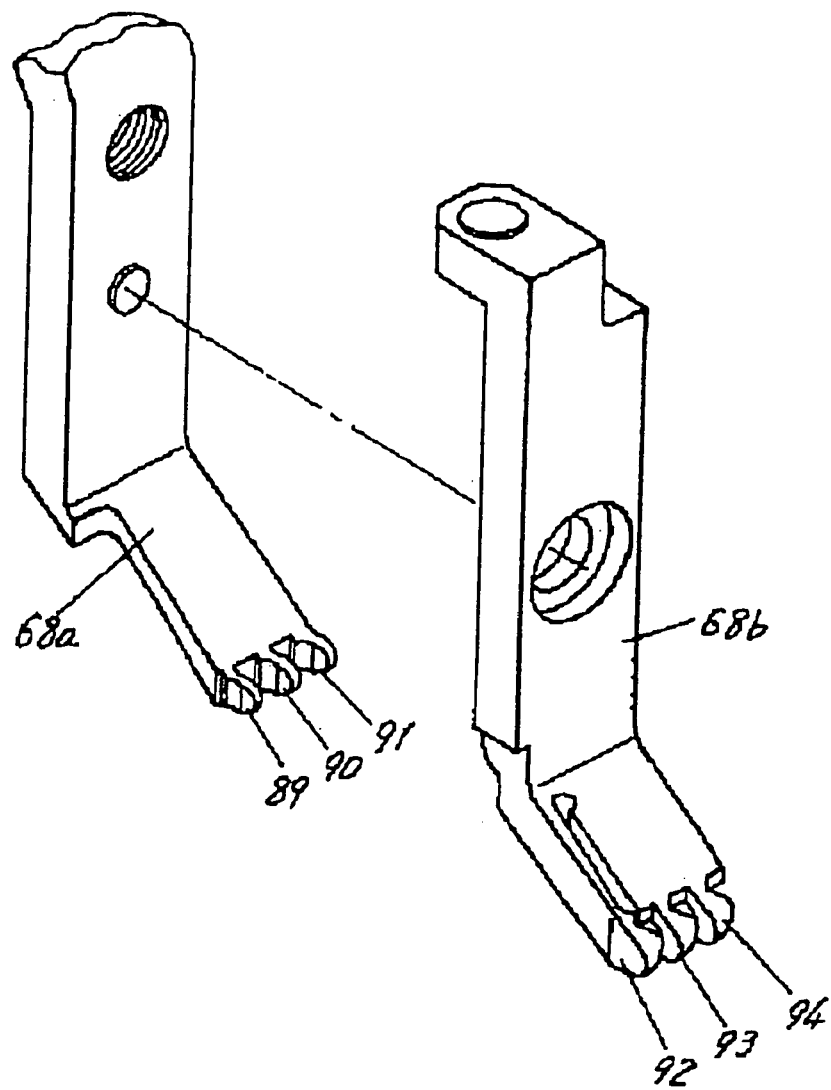
FIG. 21 is an exploded perspective view of the insertion claw of the mounting section of the mounting apparatus of the first embodiment of the present invention.
Figure 22:
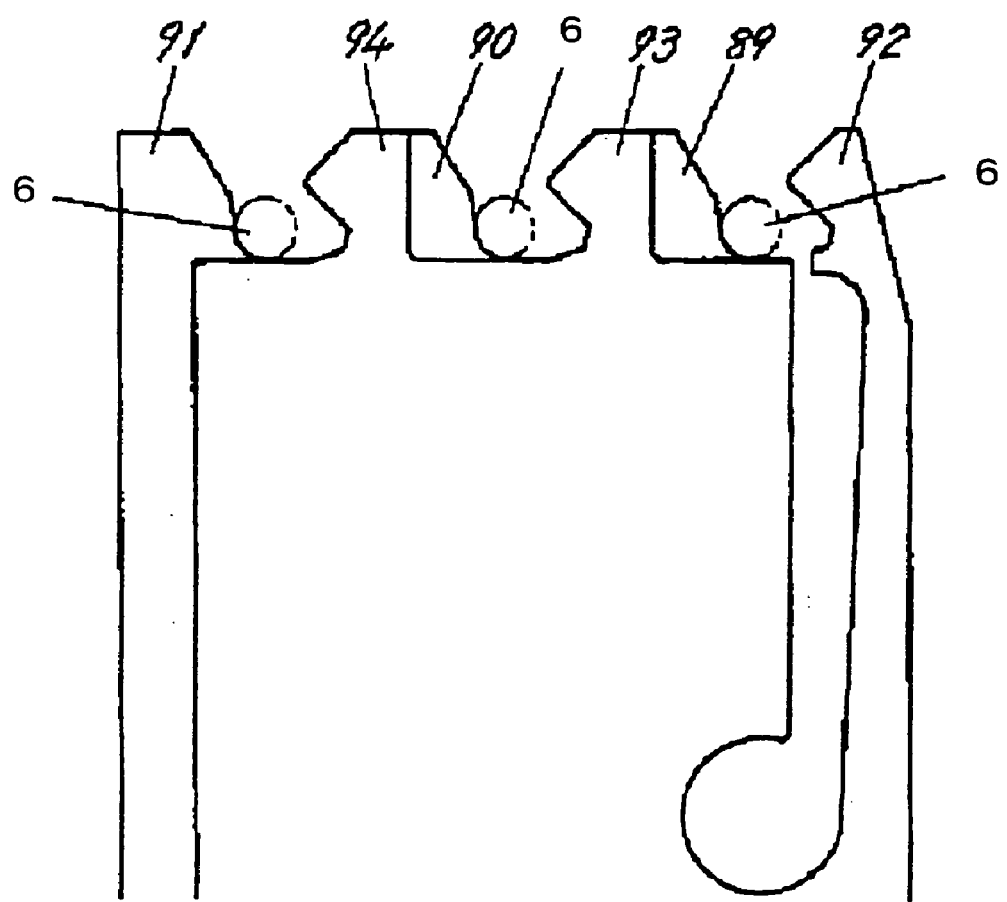
FIG. 22 is a plan view of the insertion claw of the mounting section of the mounting apparatus of the first embodiment of the present invention.
Figure 23:
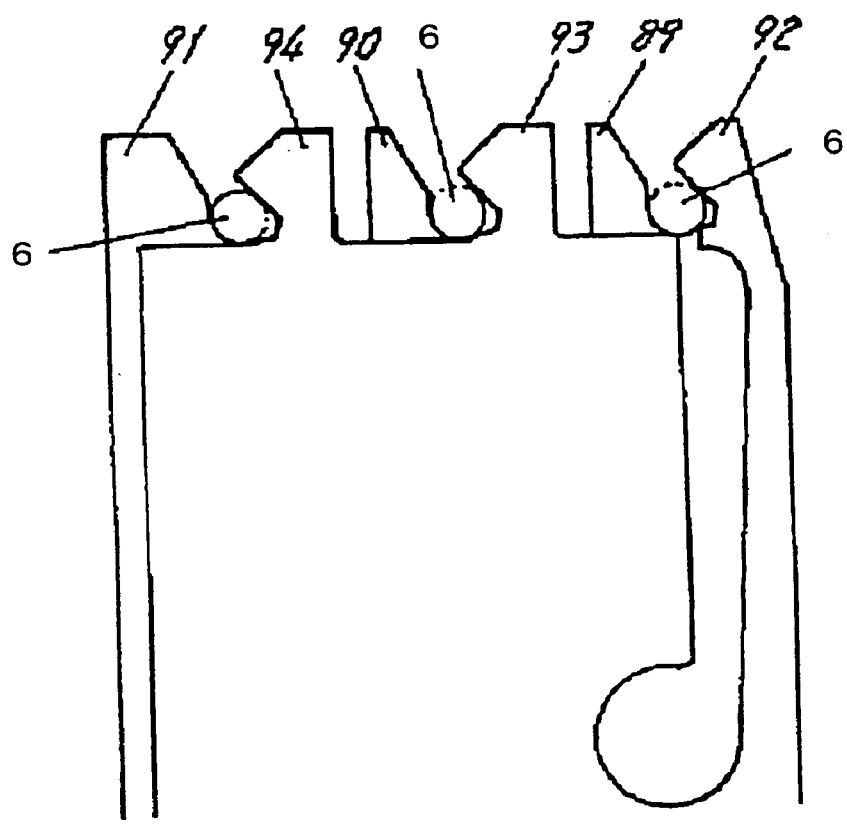
FIG. 23 is a plan view of the insertion claw of the mounting section of the mounting apparatus of the first embodiment of the present invention.

Further, three, totally six pinching claws 89 to 91, 92 to 94, are formed on a tip end side of the first, second insertion claws as shown in FIG. 21. Even if the component 3 is one having three lead terminals 6 as shown in FIGS. 22 and 23, those terminals 6 can be pinched securely by the pinching claws 89 to 94 as shown in FIGS. 22 and 23. Additionally, since the lead terminals 6 are pinched by the pinching claws 89 to 91, 92 to 94 of the first, second insertion claws 68a, 68b, respectively, there occurs no variations in pitch between the lead terminals 6, so that a mounting operation can be achieved smoothly.

Now, a cam follower 95 is rotatably provided at an upper end of the second insertion claw 68b as shown in FIG. 20. This cam follower 95 is in contact with a left-end cam surface 96 of the opening/closing lever 85.

In addition, as shown in FIG. 20, a cam follower 97 at a right end of the opening/closing lever 85 is in contact with a cam surface 98 of a cam plate 84.

Then, with this construction, as shown in FIG. 17, a spring 101 is stretched between a pin 99 of the spring lever 86 and a pin 100 of the contact portion 80c of the head body 80, and a spring 104 is stretched between a pin 102 of the pivot member 87 and a pin 103 of the contact portion 80c, wherein a tensile force is applied to each of these springs. Further, a spring 105 is provided between the lever 87c and an upper portion of the second insertion claw 68b, wherein a repulsive force is applied to this spring.

Figure 24:
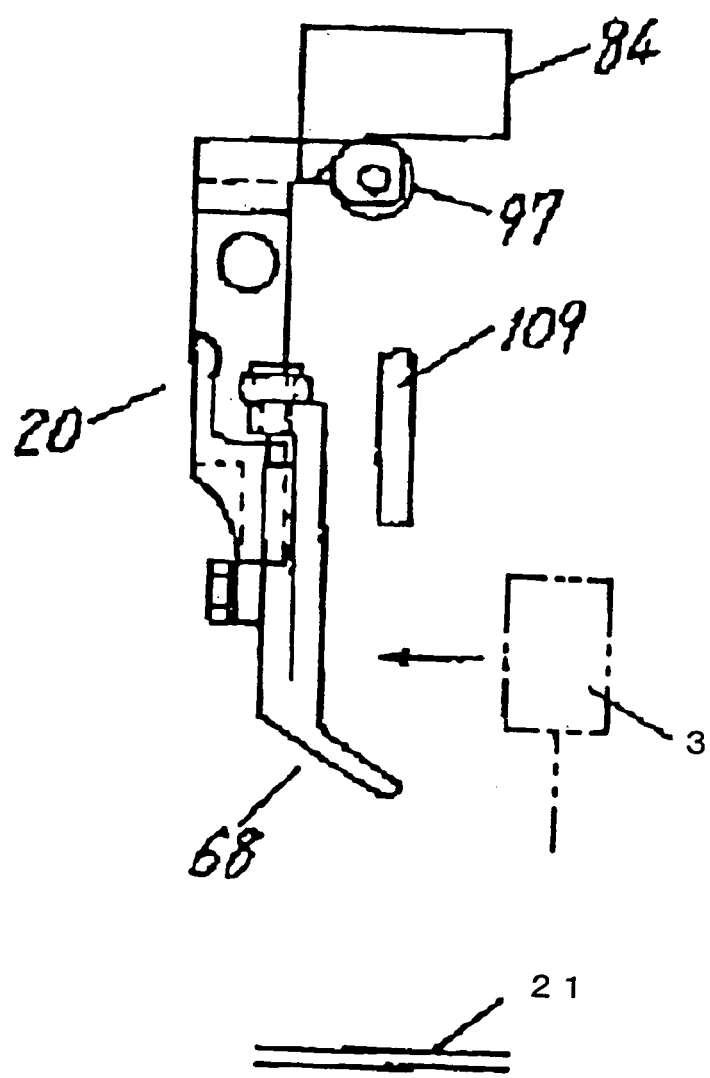
FIG. 24 is an operational explanatory view of the mounting section of the mounting apparatus of the first embodiment of the present invention.

Next, operation is explained. First, as shown in FIG. 24, at an upward place, a component 3 is transferred to the insertion claw 68 by a transfer chuck 69 of the component transfer unit 19.

In this operation, the first, second insertion claws 68a, 68b have to be opened as shown in FIG. 22. For this purpose, the core shaft 81b is pushed down by rotational power of the rotating cam 11, by which the opening/closing lever 85 is pushed down by the cam plate 84.

As a result of this, the cam surface 96 of the opening/closing lever 85 is pivoted backward, by which a frontage of the cam surface 96 comes to confront the cam follower 95 placed at an upper end of the second insertion claw 68b. Thus, an upper portion of the second insertion claw 68b is pushed rightward of FIGS. 17 and 20 by a repulsive force of the spring 105.

Then, as a result, the first, second insertion claws 68a, 68b are opened as shown in FIG. 22, in which state transfer of the component 3 from the transfer chuck 69 is performed.

Figure 10:
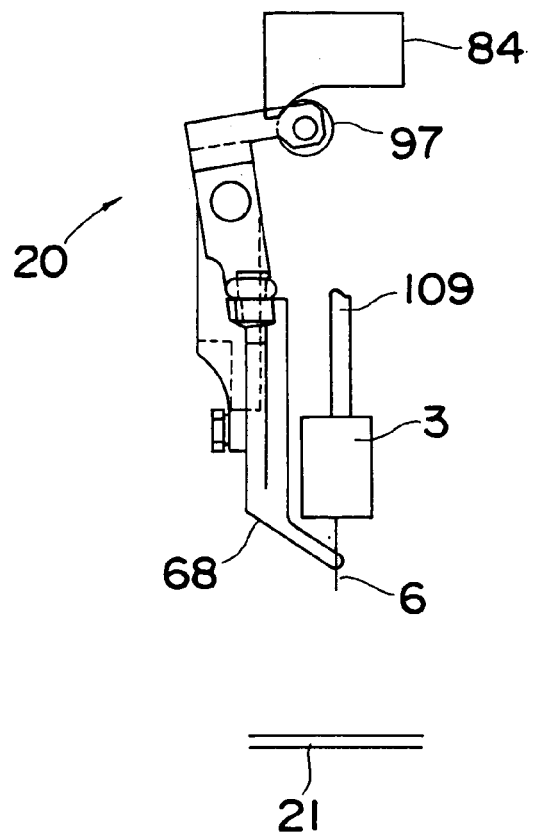
FIG. 10 is an explanatory view showing a component-insertion start operation of a mounting section of the mounting apparatus of the first embodiment of the present invention.

Next, the core shaft 81b is moved up for the closing of the first, second insertion claws 68a, 68b, by which the lead terminals (lead wires) 6 are pinched by the pinching claws 89 to 94 as shown in FIG. 23, wherein holding of the component 3 is performed as shown in FIG. 10.

Figure 25:
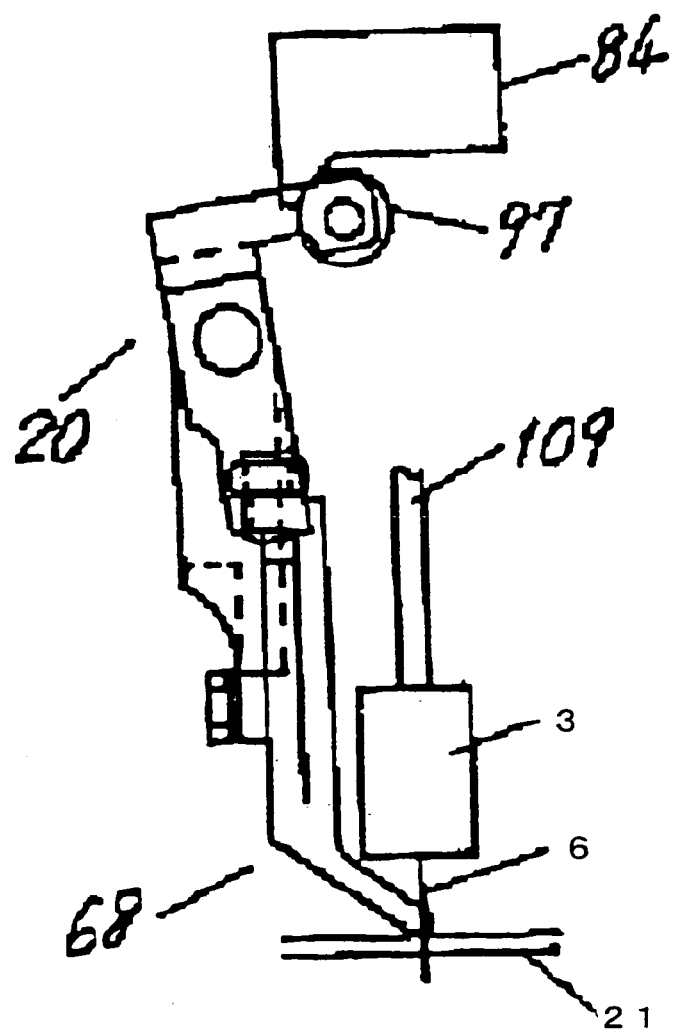
FIG. 25 is an operational explanatory view of the mounting section of the mounting apparatus of the first embodiment of the present invention.
Figure 26:
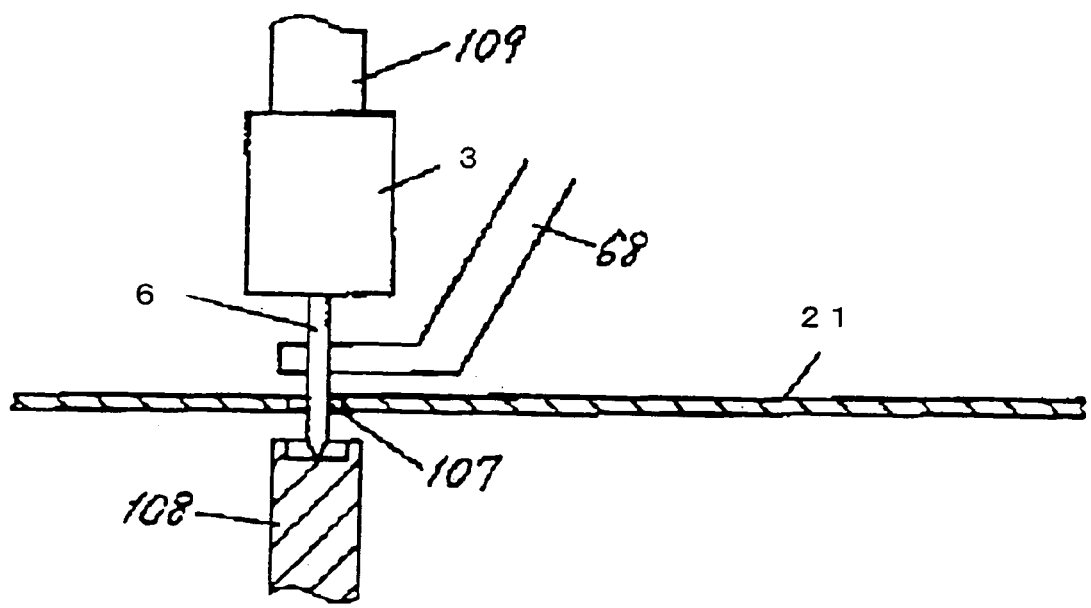
FIG. 26 is a partial sectional view showing a component insertion state by the mounting section of the mounting apparatus of the first embodiment of the present invention.

Next, the outer shaft 81a and the core shaft 81b are synchronously moved down, by which the head body 80 is lowered to the board 21 as shown in FIG. 25, wherein the plurality of lead terminals 6 are inserted into the plurality of insertion holes 22 of the board 21 of FIG. 26.

At this point, under the board 21, a receiving pin 108 that has been moved up is awaiting a move-down of the lead terminals 6. In a state that the lead, terminals 6 have been inserted into the plurality of insertion holes 22 like this, a pusher 109 provided coaxially within the core shaft 81b has been pushed down so as to be in contact with an upper end of the component 3, by which the component 3 has its upper and lower ends pinched by the pusher 109 and the receiving pin 108.

Figure 11:
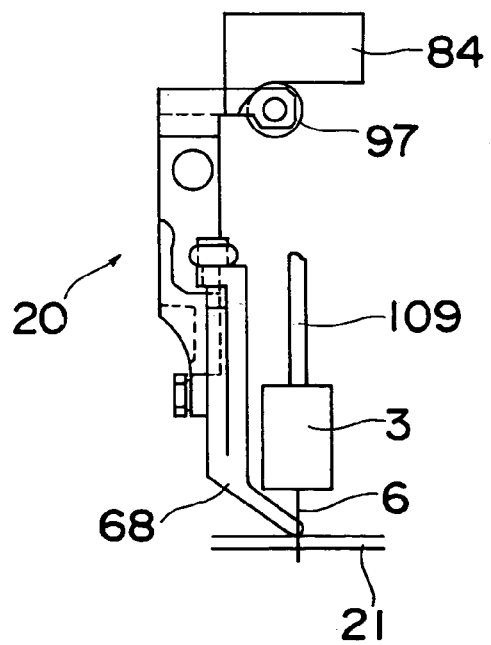
FIG. 11 is an explanatory view showing a component insertion operation of the mounting apparatus of the first embodiment of the present invention.

FIG. 11 shows a state that the core shaft 81b has been pushed down so that the first, second insertion claws 68a, 68b are opened as shown in FIG. 22. In this state, since the component 3 has its upper and lower ends pinched by the pusher 109 and the receiving pin 108 as shown in FIG. 26, the component 3 is never tilted down even if the first, second insertion claws 68a, 68b are opened.

Figure 12:
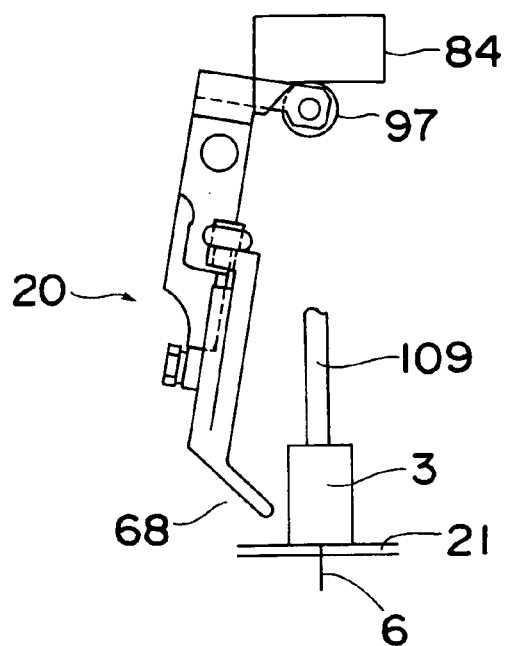
FIG. 12 is an explanatory view showing a component-insertion completing operation of the mounting apparatus of the first embodiment of the-present invention.
Figure 27:
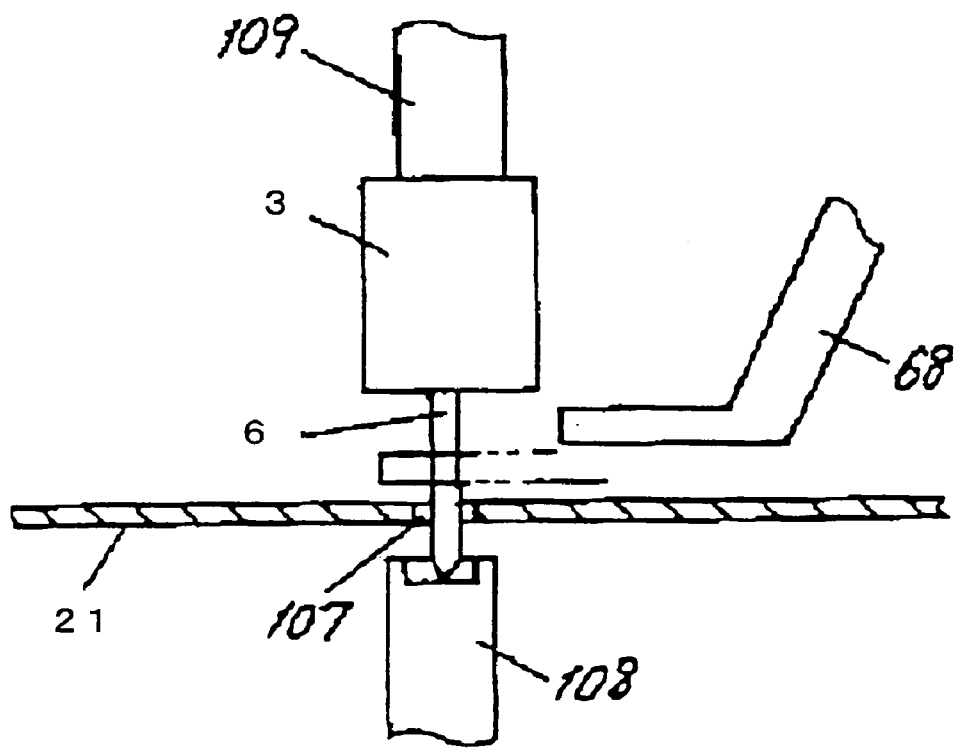
FIG. 27 is a partial sectional view showing a component insertion state by the mounting section of the mounting apparatus of the first embodiment of the present invention.
Figure 28:
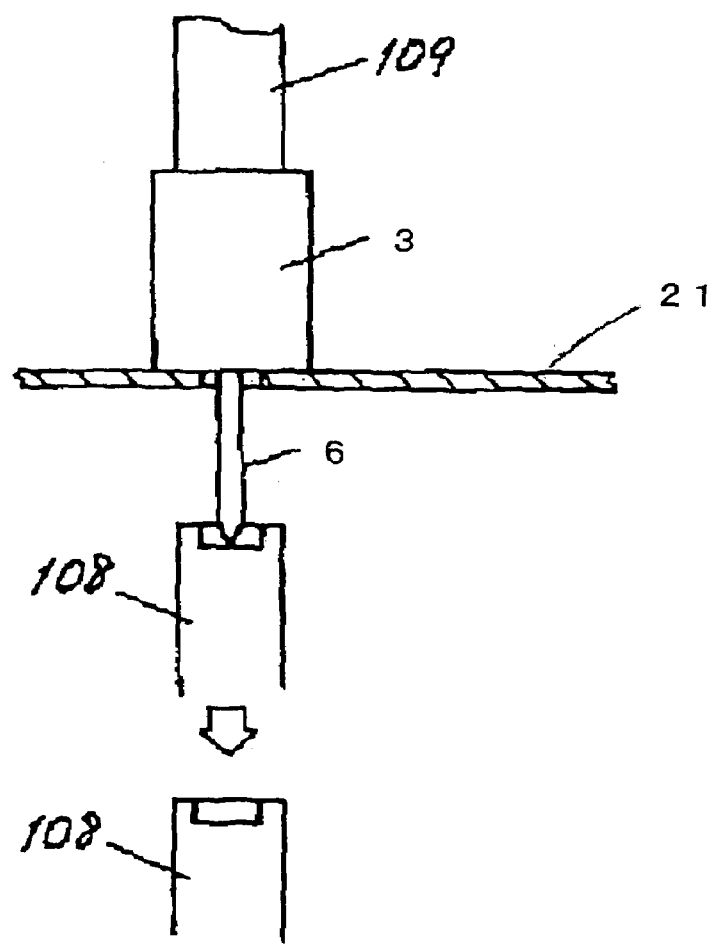
FIG. 28 is a partial sectional view showing a component insertion state by the mounting section of the mounting apparatus of the first embodiment of the present invention.

In this state, first, the insertion claw 68 escapes outward of the component 3 as shown in FIG. 27. Upon completion of this escape, the pusher 109 and the receiving pin 108 start to move down, so that the component 3 has its lower end eventually brought into contact with a top face of the board 21 as shown in FIGS. 12 and 28. Next, with a top face of the component 3 pressed by the pusher 109, the receiving pin 108 is moved down as shown in FIG. 28, and thereafter lower ends of the plurality of lead terminals 6 are cut and clinched by the lead-wire support member (anvil mechanism) 26. Thus, mounting of the component 3 is completed.

FIGS. 5A and 5B are timing charts, respectively, of a mounting operation of the mounting apparatus of the first embodiment of the present invention. In FIGS. 5A and 5B, the term "cam power" refers to a driving force of the rotating-cam drive unit 14. The term "insertion head up-and-down rotating cam" refers to the mounting section up-and-down rotating cam 11 for moving up and down the mounting section 20. The term, "pusher up-and-down rotating cam" refers to a pusher up-and-down rotating cam (not shown) for moving up and down the pusher 109. The term "X-Y table" refers to the X-direction drive unit 23 and the Y-direction drive unit 24 of the X-Y table 25. Further, in FIG. 5A, reference character (a) shows a state of a component insertion start operation of FIG. 10, (b) shows a state of a component insertion operation of FIG. 11, (c) shows a state of a component insertion completion of FIG. 12, and (d) shows a state of a move-up operation after component insertion of FIG. 13.

In the following description of operation, first, since a driving state of the rotating-cam drive unit 14 needs to be changed in response to a distance between mounting positions for successive component mounting operations on the board 21 of the X-Y table 25, this operation description is parted by a criterion, whether or not the distance is not more than 30 mm, as an example.

First described is a case, as shown in FIG. 5A, where the distance between mounting positions for successive component mounting operations on the board 21 of the X-Y table 25 is not more than 30 mm, i.e., where a time for moving the board 21 by the X-Y table 25 is shorter than a move-down and -up time of the insertion head and the pusher 109.

Figure 6:
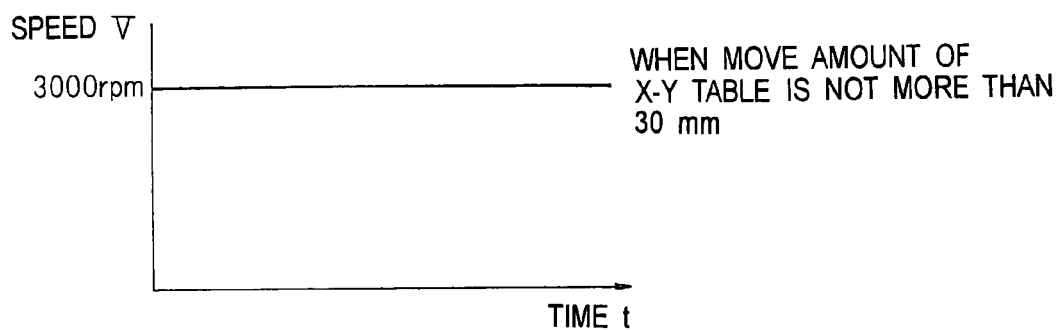
FIG. 6 is a graph showing a relationship between speed and time for presenting a speed waveform of a rotating cam drive unit of the mounting apparatus of the first embodiment of the present invention, wherein a movement amount of an X-Y table is not more than 30 mm.

Referring to FIG. 5A, while a rotational angle of each rotating cam changes from 0 to 180 degrees, then returns again to 0 degrees, and further via 180 degrees, returns to 0 degrees, the rotating-cam drive unit 14 normally continues rotating at, for example, 3000 rpm, continuously outputting the cam power. A speed waveform of the rotating-cam drive unit 14 in this case is shown in FIG. 6.

First, during a period in which the rotational angle of each rotating cam is in the range of 0 to around 90 degrees, the insertion head is positionally held at an upper-end position by the insertion head up-and-down rotating cam as shown by (a) of FIG. 5A and FIG. 10, and moreover the pusher 109 is also positionally held at an upper-end position by the pusher-109-up-and-down rotating cam. In this case, the X-direction drive unit 23 and the Y-direction drive unit 24 of the X-Y table 25 are rotationally driven at 3000 rpm, which is a maximum speed, to perform drive control so that a succeeding mounting position of the board 21 held on the X-Y table 25 comes to under the insertion head.

When the rotational angle of each rotating cam becomes around 90 degrees, the insertion head starts to be moved down from the upper-end position toward the lower-end position by the insertion head up-and-down rotating cam, and moreover the pusher 109 also starts to be moved down from the upper-end position toward the lower-end position by the pusher 109 up-and-down rotating cam. At this point, the X-direction drive unit 23 and the Y-direction drive unit 24 of the X-Y table 25 enter a deceleration operation.

When the rotational angle of each rotating cam becomes around 180 degrees, the succeeding mounting position of the board 21 is positioned under the insertion head by the drive of the X-direction drive unit 23 and the Y-direction drive unit 24 of the X-Y table 25, wherein the drive of the X-direction drive unit 23 and the Y-direction drive unit 24 is halted. At this point, the insertion head continues to be moved down from the upper-end position toward the lower-end position by the insertion head up-and-down rotating cam, and moreover the pusher 109 also continues to be moved down from the upper-end position toward the lower-end position by the pusher 109 up-and-down rotating cam.

When the rotational angle of each rotating cam becomes beyond 180 degrees, the insertion head reaches the lower-end position and is once stopped from moving down by rotation of the insertion head up-and-down rotating cam 12, and after maintaining a halt state during several degrees of the rotational angle of each rotating cam, starts to move up, as shown by (b) of FIG. 5A and FIG. 11. In this operation, as shown by (c) of FIG. 5A and FIG. 12, the pusher 109 also reaches the lower-end position with a slight delay behind the insertion head by the pusher 109 up-and-down rotating cam, but immediately starts to move up. In this case, drive of X-direction drive unit 23 and the Y-direction drive unit 24 is maintained halted.

During a period in which the rotational angle of each rotating cam is around 180 degrees and up to 270 degrees after passage of the angle, the plurality of lead terminals 6 of the component 3 held by the insertion head starts to be inserted and completely inserted by press of the pusher 109 into the plurality of insertion holes 22 of specified mounting positions of the board 21 held on drive-halted X-Y table 25, and then the lead terminals 6 are further cut and clinched by the anvil mechanism 26. Thus, mounting of the component 3 onto the board 21 is completed.

Figure 13:
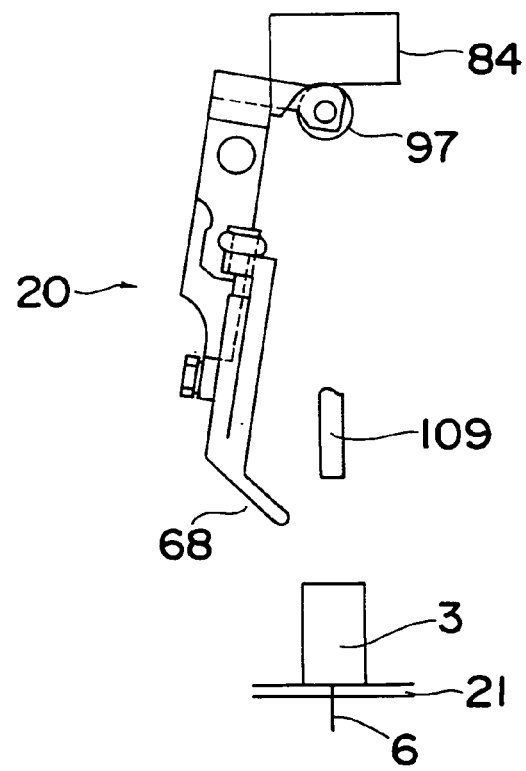
FIG. 13 is an explanatory view showing a move-up operation after component insertion of the mounting apparatus of the first embodiment of the present invention.

When the rotational angle of each rotating cam becomes around 270 degrees, the insertion head is positionally held at the upper-end position again by the insertion head up-and-down rotating cam as shown by (d) of FIG. 5A and FIG. 13.

When the rotational angle of each rotating cam becomes over 270 degrees and around 360 degrees (i.e., 0 degrees), the pusher 109 is also positionally held at the upper-end position again by the pusher 109 up-and-down rotating cam. In this case, the X-direction drive unit 23 and the Y-direction drive unit 24 of the X-Y table 25 are rotationally driven at 3000 rpm, which is the maximum speed, to perform drive control so that a succeeding mounting position of the board 21 held on the X-Y table 25 comes to under the insertion head. Drive start, driving, and drive halt of the X-direction drive unit 23 and the Y-direction drive unit 24 of the X-Y table 25 are performed when the insertion head is positioned at the upper-end position or its proximity, and moreover the pusher 109 is also positioned at the upper-end position or its proximity.

When the distance between mounting positions for successive component mounting operations on the board 21 of the X-Y table 25 is not more than 30 mm, the above-described steps are iterated in principle.

Figure 14:
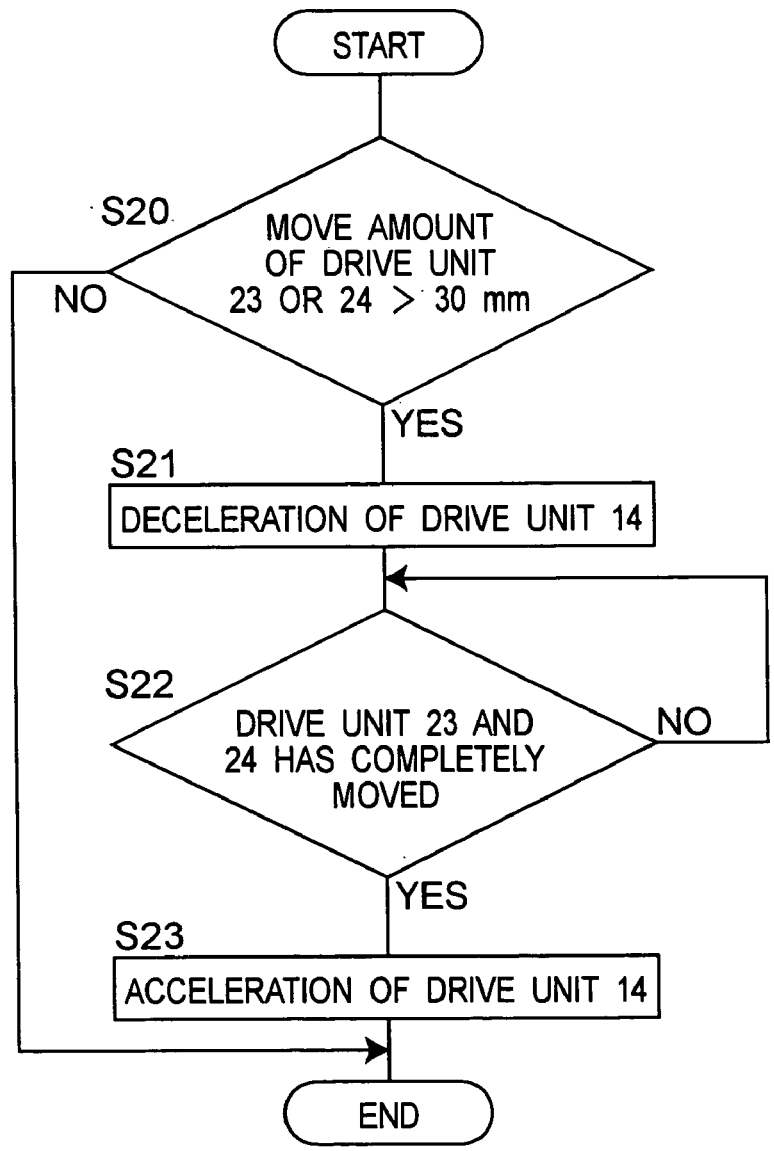
FIG. 14 is a flowchart of a deceleration deciding operation of a drive unit of the mounting apparatus of the first embodiment of the present invention.

However, when the distance between mounting positions for successive component mounting operations on the board 21 of the X-Y table 25 is over 30 mm and, for example, 100 mm, steps to be performed are as shown in FIG. 5B (see step S20 of FIG. 14; it is decided whether or not a movement amount of the board 21 by drive of the X-direction drive unit 23 or the Y-direction drive unit 24 is over 30 mm. Only when the movement amount is over 30 mm, steps S21 to S23 are performed; when the movement amount is not over 30 mm, steps S21 to S23 are not performed).

More specifically, a time for moving the board 21 by the X-Y table 25 becomes longer than the move-down and -up time of the insertion head and the pusher 109, so that operation allocation time and halt allocation time increase. That is, referring to FIG. 5A, assuming that a period in which the rotational angle of each rotating cam changes from 0 to 180 degrees and then returns again to 0 degrees is set as one operation allocation period, positions of 180 degrees and 0 degrees in a second operation allocation period correspond to positions of 180 degrees and 0 degrees of the first operation allocation period of FIG. 5B. This means that an operation allocation period in FIG. 5B becomes double an operation allocation period in FIG. 5A.

While the rotational angle of each rotating cam progresses from 0 to 180 degrees in the first operation allocation period in FIG. 5B, the rotating-cam drive unit 14 is decelerated, for example, from 3000 rpm to 0 rpm in consideration of a drive time of the X-Y table 25 for the board 21 as described later (see step S21 in FIG. 14; the rotating-cam drive unit 14 is decelerated. This deceleration operation is performed until drive of the X-direction drive unit 23 or the Y-direction drive unit 24 is completed at step S22 of FIG. 14). Then, the rotating-cam drive unit 14, after once halted with the rotational angle of each rotating cam in proximity to 90 degrees, is immediately accelerated to 3000 rpm to output the cam power so that 3000 rpm is maintained during the period from around 180 degrees to 360 degrees (0 degrees).

While the rotational angle of each rotating cam is within a range of 0 to 180 degrees, the insertion head is positionally held at the upper-end position by the insertion head up-and-down rotating cam, and moreover the pusher 109 is also positionally held at the upper-end position by the pusher 109 up-and-down rotating cam, as shown in FIG. 10. In the period in which the rotational angle of each rotating cam is within the range of 0 to 90 degrees, the X-direction drive unit 23 and the Y-direction drive unit 24 of the X-Y table 25 are rotationally driven at 3000 rpm, which is the maximum speed, to perform drive control so that a succeeding mounting position of the board 21 held on the X-Y table 25 is positioned under the insertion head. When the rotational angle of each rotating cam becomes around 90 degrees, the X-direction drive unit 23 and the Y-direction drive unit 24 of the X-Y table 25 are decelerated so as to be stopped from being driven.

When the rotational angle of each rotating cam becomes around 180 degrees, the insertion head starts to be moved down from the upper-end position toward the lower-end position by the insertion head up-and-down rotating cam, and moreover the pusher 109 also starts to be moved down from the upper-end position to the lower-end position by the pusher 109 up-and-down rotating cam.

When the rotational angle of each rotating cam becomes over 180 degrees, the insertion head reaches the lower-end position and is once stopped from moving down by the rotation of the insertion head up-and-down rotating cam 12, and after maintaining the halt state during several degrees of the rotational angle of each rotating cam, starts to move up, as shown in FIG. 11. In this operation, as shown in FIG. 12, the pusher 109 also reaches the lower-end position with a slight delay behind the insertion head by the pusher 109 up-and-down rotating cam, but immediately starts to move up. In this case, the drive of X-direction drive unit 23 and the Y-direction drive unit 24 is maintained halted.

During the period in which the rotational angle of each rotating cam is around 180 degrees and up to 270 degrees after passage of the angle, the plurality of lead terminals 6 of the component 3 held by the insertion head start to be inserted and completely inserted by press of the pusher 109 into the plurality of insertion holes 22 of specified mounting positions of the board 21 held on drive-halted X-Y table 25, and then the lead terminals 6 are further cut and clinched by the anvil mechanism 26. Thus, mounting of the component 3 onto the board 21 is completed.

When the rotational angle of each rotating cam becomes around 270 degrees, the insertion head is positionally held at the upper-end position again by the insertion head up-and-down rotating cam as shown in FIG. 13.

When the rotational angle of each rotating cam becomes over 270 degrees and around 360 degrees (i.e., 0 degrees), the pusher 109 is also positionally held at the upper-end position again by the pusher 109 up-and-down rotating cam. In this case, the X-direction drive unit 23 and the Y-direction drive unit 24 of the X-Y table 25 are accelerated from a halt state so as to be rotationally driven at 3000 rpm, which is the maximum speed, (see step S23 of FIG. 14; the rotating-cam drive unit 14 is driven for acceleration) to perform drive control so that the succeeding mounting position of the board 21 held on the X-Y table 25 comes to under the insertion head. The drive start, driving, and drive halt of the X-direction drive unit 23 and the Y-direction drive unit 24 of the X-Y table 25 are performed when the insertion head is positioned at the upper-end position or its proximity, and moreover the pusher 109 is also positioned at the upper-end position or its proximity.

As described above, the drive operation of each drive member largely differs between a case where the distance between mounting positions for successive component mounting operations on the board 21 of the X-Y table 25 is not more than 30 mm, and a case where the distance is over 30 mm, e.g. 100 mm.

Figure 7:
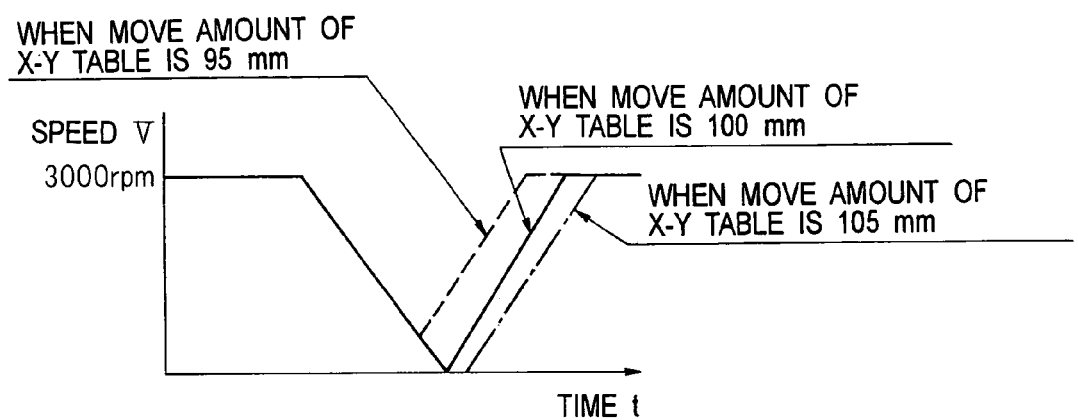
FIG. 7 is a graph showing a relationship between speed and time for presenting a speed waveform of the rotating-cam drive unit of the mounting apparatus of the first embodiment of the present invention, wherein the movement amount of the X-Y table is over 30 mm.

A reason for this is explained based on FIG. 7. FIG. 7 is a graph showing a relationship between speed and time for presenting a speed waveform of the rotating-cam drive unit 14, where a movement amount of the X-Y table 25 is over 30 mm.

A graph in which a "down" is depicted by a solid line and an "up" is depicted by a dotted line shows a state that given a movement amount of 95 mm of the X-Y table 25, the speed is reduced from 3000 rpm and, without a halt once at around 0 rpm, changed from deceleration to acceleration. In this state, the rotating-cam drive unit 14 is not so much loaded.

A graph in which a "down " is depicted by a solid line and an "up " is depicted by a solid line shows a state that given a movement amount of 100 mm of the X-Y table 25, the speed is reduced from 3000 rpm and, after a halt once, immediately accelerated. In this state, the rotating-cam drive unit 14 is much loaded.

A graph in which a "down " is depicted by a solid line and an "up " is depicted by a one-dot chain line shows a state that given a movement amount of 105 mm of the X-Y table 25, the speed is reduced from 3000 rpm and, with a slight halt at around 0 rpm, thereafter changed to acceleration. In this state, the rotating-cam drive unit 14 is not so much loaded.

Accordingly, it is when the movement amount of the X-Y table 25 is 100 mm that the rotating-cam drive unit 14 is most loaded. That is, the rotating-cam drive unit 14 is most loaded when the rotating-cam drive unit 14 is driven for deceleration and, with a halt once, immediately driven for acceleration. Iterating such an operation would involve a continued state in which effective torque over 110% of a rated torque is necessary, wherein abrupt temperature increases would occur in the drive units 10, 14, 23, 24, which would cause failures. The present embodiment is intended to prevent failures of the rotating-cam drive unit 14 without halting the operation, in a case where such an overload state of the rotating-cam drive unit 14 continues, by reducing a load against such an overload-state operation, for example, as in a state shown by a dotted line, before occurrence of any failure of the rotating-cam drive unit 14. However, whereas the movement amount of 100 mm causes a most overload-acting state in the above example, the distance varies in many ways due to various factors such as characteristics of the rotating-cam drive unit 14, structure, material, and thermal resistance of other devices and mechanisms, a cooling function, and the like. A distance of 90 mm can be the distance at which overload-acts most for one rotating-cam drive unit 14, while a distance of 110 mm can be the distance at which overload acts most for another rotating-cam drive unit 14. Therefore, in summary, in this embodiment, since the overload acts most when a drive unit targeted for detection of effective torque is operated so as to be decelerated, halted once, and then immediately accelerated, and since failures more likely take place when such an overload state occurs in succession for a certain number of times (i.e., which could be called number of successive overload operations that induce failures; the number differs depending on characteristics of the drive unit or its use environment), the drive unit is so designed that when overload-state operations are performed for a specified number of times (i.e., permissible number of successive overload operations) smaller than the above certain number of times, similar overload-state operations are not performed any more and, instead, the operation is continued with a sufficiently light load state without any halt of operation, by which considerable reduction of production efficiency (i.e., reduction of production efficiency due to a halt of the drive unit) is prevented.

In a mounting apparatus of such a constitution, an effective torque detecting section 27 determines effective torque for operation of each of the drive units 10, 14, 23, 24 (at least rotating-cam drive unit on a basis of an effective torque detection period (a specified period unit which is a period for detecting effective torque periodically), and informs an effective torque deciding section 28 of detection results on a detection-period basis. That is, the effective torque detecting section 27 determines an effective value of a specified period that is a detection period from a torque of which is informed by a torque detector contained in or fitted to each of the drive units 10, 14, 23, 24 and which is needed (e.g., within a specified time) by-each of the drive units 10, 14, 23, 24, and then informs the effective torque deciding section 28 of an effective value determined for each of the drive units 10, 14, 23, 24. The specified period as the detection period is usually set to not more than 1 sec., and the period for detecting an effective torque and informing the effective torque deciding section 28 of the effective torque is set also to not more than 1 sec. Thus, detecting the effective torque at such a short period of not more than 1 sec. makes it possible to detect the effective torque reliably even with load changes due to any abnormalities.

Although it is convenient that the detection period is constant at all times, yet without being limited to this, the detection period may be set more roughly for periods immediately after start-up of drive units 38, 39, 40, 41, i.e., periods in which temperature of the drive units 38, 39, 40, 41 has not increased so much relative to an ambient temperature so that an abrupt temperature increase immediately causing a failure does not occur even with the effective torque over an upper-limit value.

Also, setting all or some of detection periods of the drive units 10, 14, 23, 24 coincident with one another makes it possible to provide a simpler, more convenient structure. However, without being limited to this, the detection period may differ among the drive units 10, 14, 23, 24 in consideration of a motor type and a level of load application.

The effective torque deciding section 28 decides whether or not an effective torque of any one of the drive units 10, 14, 23, 24 has exceeded a specified upper-limit value, based on results from the effective torque detecting section 27, and then informs the control section 2 of this decision result. For example, when the effective torque of any one of the drive units has exceeded the specified upper-limit value, the control section 2 controls drive of the one of the drive units so that this drive unit is decelerated to a specified rotational speed. In this case, if necessary, the other drive units may also be drive-controlled appropriately in accordance with the above drive control of the any one drive unit.

The specified upper-limit value for each drive unit is ordinarily set to a value that is 105% of a rated torque of each drive unit 10, 14, 23, 24. This value is one corresponding to a permissible number of successive overload operations in continuously performing the overload operation that the drive units 10, 14, 23, 24 are decelerated, once halted and then immediately accelerated. The drive units 10, 14, 23, 24 are ordinarily presumed to be used at at most 100% of the rated torque. In particular, in a continued state that an effective torque over 110% of the rated torque is needed, there would occur an abrupt temperature increase to the drive units 10, 14, 23, 24, thereby causing failures. A setting of the upper-limit value to 105% of the rated torque makes it possible to prevent the abrupt temperature increase.

The upper-limit values for the drive units 10, 14, 23, 24 have been set to 105% of their rated torques for convenience' sake. However, without being limited to this, the upper-limit values of effective torques may differ among the drive units 10, 14, 23, 24 in consideration of a type and thermal characteristics of the motor.

After the any one drive unit has been decelerated to a specified rotational speed, the any one drive unit is accelerated to an original rotational speed at a time point when the effective torque for the any one drive unit has recovered to a specified lower-limit value, i.e., a safety value.

This safety value is ordinarily set to a value that is 95% of the rated torque. In this connection, although the safety value may be set to 100% of the rated torque, there is no margin to the 105% of the rated torque, which is the upper-limit value, so that the effective torque may go beyond the upper-limit value immediately when the original rotational speed has been restored. Such a state, if continued, would cause occurrence of a case where a temperature would not lower at the drive units 10, 14, 23, 24. Furthermore, as a frequency of deceleration and acceleration of the rotational speed would increase, there is a fear that the machine productivity would lower, conversely. Thus, an appropriate value for the safety value is 95% of the rated torque.

In addition, respective safety values for the drive units 10, 14, 23, 24 are not limited to 95% of their respective rated torques, and the specified safety values may differ among the drive units 10, 14, 23, 24 in consideration of a type, thermal characteristics, and the like of the motor.

Figure 2:
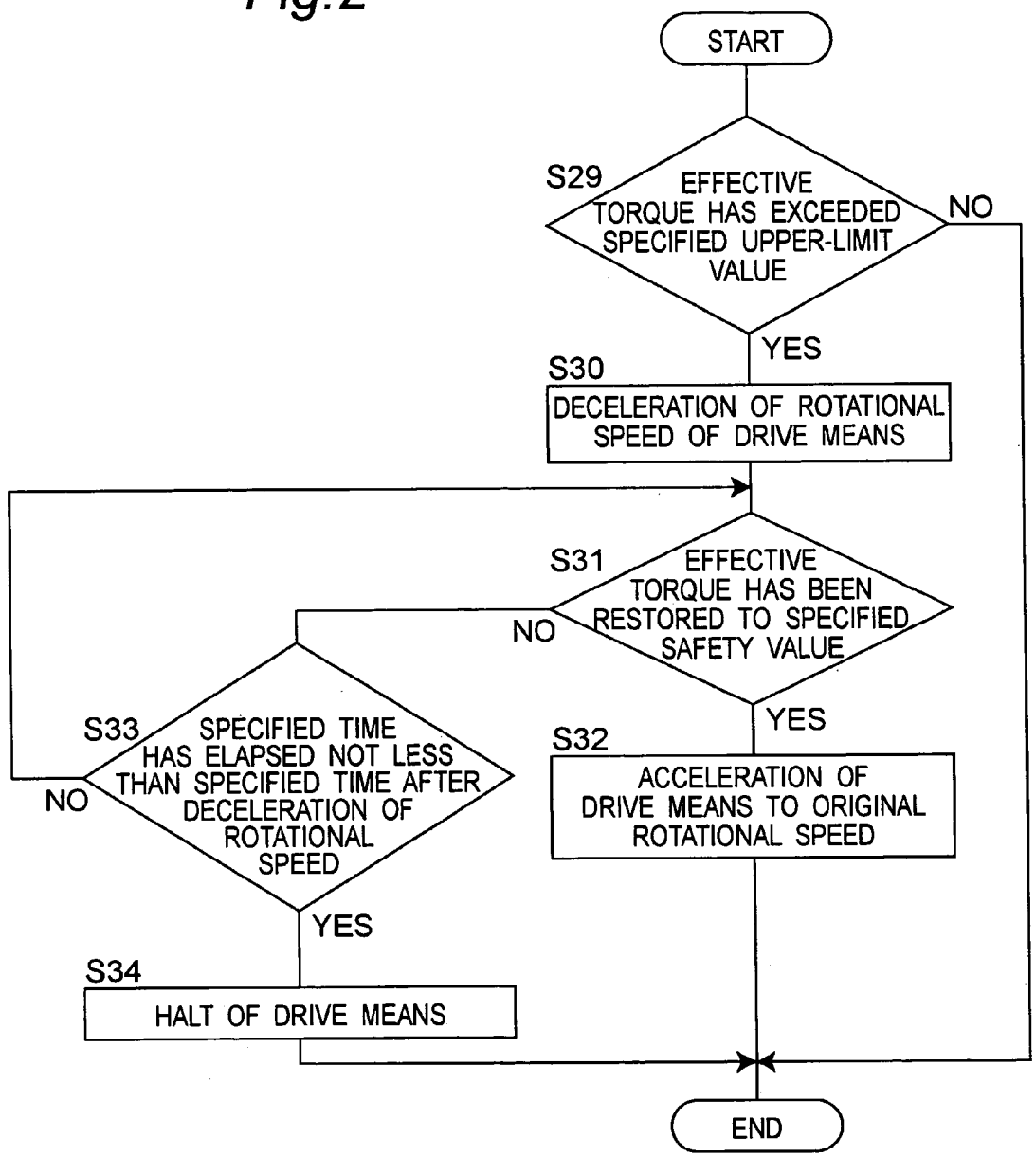
FIG. 2 is a flowchart of an effective torque deciding section of the mounting apparatus of the first embodiment.

This operation is explained with reference to FIG. 2.

Based on results of which the effective torque detecting section 27 has informed the effective torque deciding section 28, at decision step S29, it is decided by the effective torque deciding section 28 whether or not any one of the effective torques has exceeded its specified upper-limit value. These specified upper-limit values are ordinarily set to values that are 105% of the rated torques of the drive units 10, 14, 23, 24, as described above.

For instance, if the effective torque of any one of the drive units 10, 14, 23, 24 has exceeded its specified upper-limit value, then, at processing step S30, the effective torque deciding section 28 informs the control section 2 of a deceleration to a specified speed that is slower than a rotational speed at which the any one drive unit is currently running and, then, under control of the control section 2, the rotational speed of the any one drive unit is decreased to a lower-limit value, i.e. safety value. This safety value is ordinarily set to a value that is 95% of the rated torque as described above.

The drive units 10, 23, 24 are respectively so designed as to intermittently operate at certain predetermined rotational positions, i.e. rotational angles, of the rotating cams 11, 12, 13 each connected to the rotating-cam drive unit 14 via a mechanical mechanism. Therefore, decelerating the rotating-cam drive unit 14 causes an operation allocation time and a halt allocation time of the drive units 10, 23, 24 to increase. Thus, it becomes possible to cause the effective torque to lower.

At decision step S31, it is decided whether or not the any one drive unit whose rotational speed had been decreased has recovered to the safety value.

At decision step S32, if the effective torque deciding section 28 decides that the effective torque of the any one drive unit has recovered to the safety value, the effective torque deciding section 28 informs the control section 2 to accelerate the any one drive unit to the original rotational speed, and the any one drive unit is accelerated by the control section 2.

Meanwhile, at decision step S33, it is decided whether or not at least a specified time has elapsed since the any one drive unit was rotationally decelerated. If the at least specified time has elapsed, the any one drive unit as well as the other drive units are halted at processing step S34, on a decision that some other abnormality has occurred at the any one drive unit.

In addition, also when the drive units 10, 14, 23, 24 are each composed of a servomotor and a drive control device, those drive units can be controlled by the control section 2 with the same constitution.

Further, also when the drive units 10, 14, 23, 24 are each composed of a motor controlled by an inverter and a drive control device, those drive units can be controlled by the control section 2 with the same constitution.

Furthermore, also when the drive units 10, 14, 23, 24 are each composed of a stepping motor and a drive control device, those drive units can be controlled by the control section 2 with the same constitution.

(Second Embodiment)

Next, a mounting apparatus according to a second embodiment of the present invention is described with reference to FIG. 3.

Figure 3:
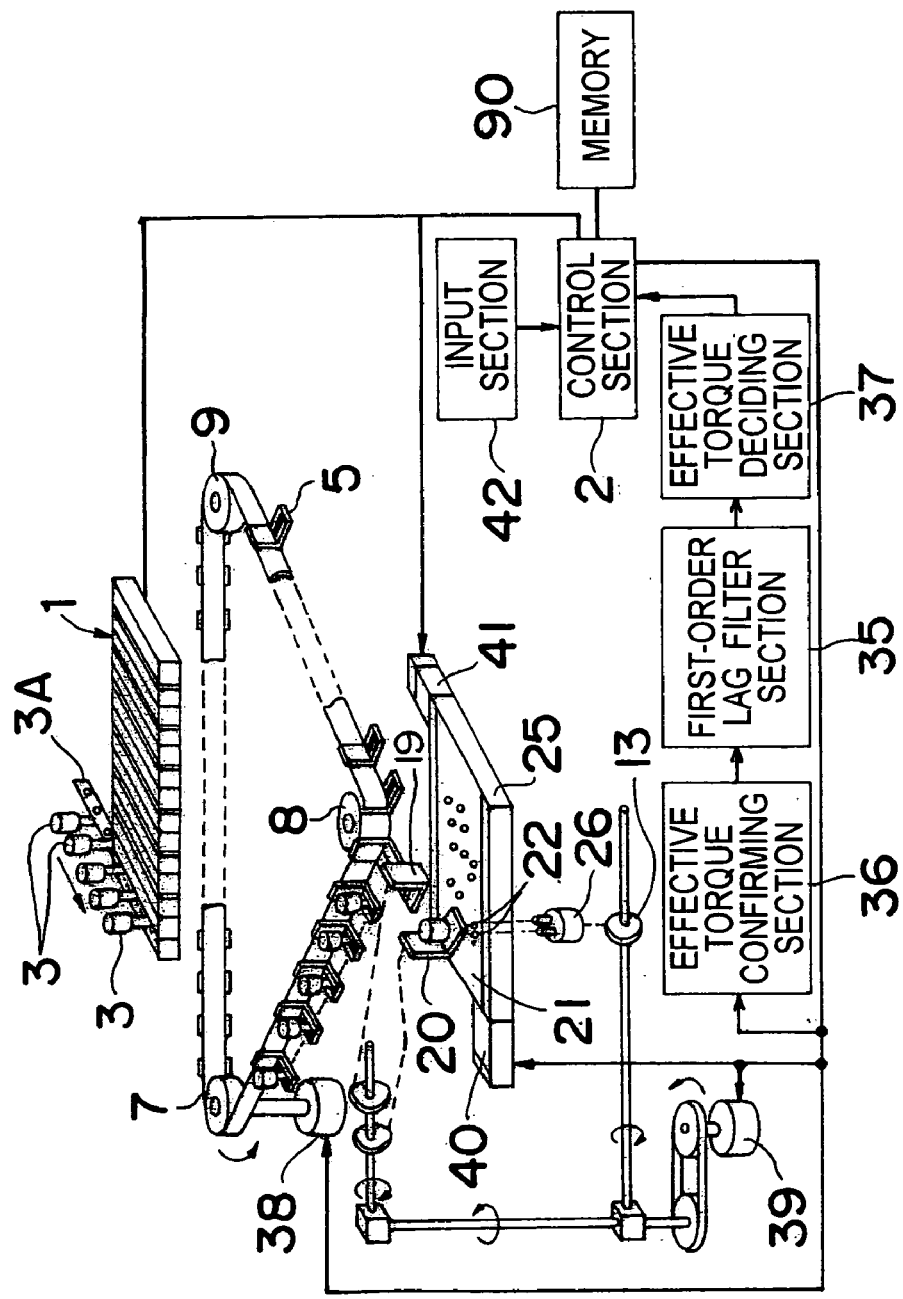
FIG. 3 is a block diagram of a mounting apparatus according to a second embodiment of the present invention.

As shown in FIG. 3, a first-order lag filter section 35 as an example of detection error eliminating means is added to the above-described mounting apparatus of the first embodiment.

The first-order lag filter section 35, with a time constant set to T, receives a value of effective torque from an effective torque detecting section 36 (equivalent to the effective torque detecting section 27), and outputs this result to an effective torque deciding section 37 (equivalent to the effective torque deciding section 28).

Temperatures of the drive units 38, 39, 40, 41 increase in first-order lag fashions with respect to effective torques. If an effective torque has exceeded an upper-limit value and a temperature increase remains, the drive units 38, 39, 40, 41 would lead to a failure. However, immediately after start-up of the drive units 38, 39, 40, 41, i.e., in periods in which a temperature of the drive units has not increased so much relative to ambient temperature, an abrupt temperature increase immediately causing a failure does not occur even with the effective torque over the upper-limit value. Meanwhile, since the effective torque, which is within a specified period, may exceed the upper-limit value for the effective torque even immediately after the start-up, the drive units 38, 39, 40, 41, in such a case, might be decelerated due to excess of the effective-torque upper-limit value even without temperature increase, which could cause productivity to deteriorate. Therefore, the effective torque is passed through the first-order lag filter section 35, and the effective torque deciding section 37 is informed of this result, thus making it possible to eliminate a decrease of rotational speed of the drive units 38, 39, 40, 41 immediately after the start-up, and to prevent productivity deterioration.

Figure 8:
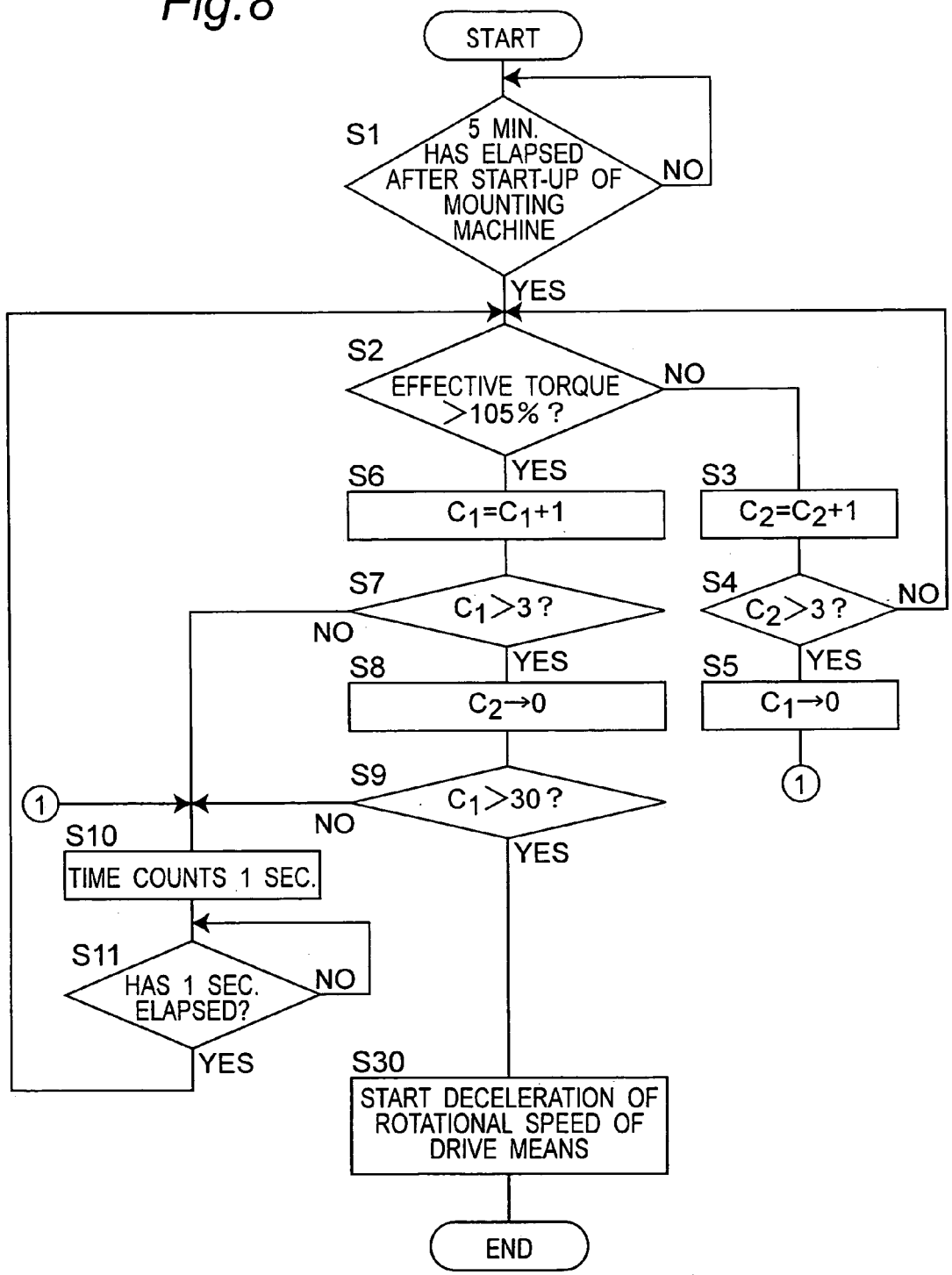
FIG. 8 is a flowchart showing operation of a first-order lag filter section of the mounting apparatus of the second embodiment of the present invention.

More specifically, as shown in FIG. 8, at step S1, it is decided by the first-order lag filter section 35 whether or not 5 min. has elapsed after start-up of the drive units 38, 39, 40, 41. If 5 min. has not elapsed, effective torques obtained by the effective torque detecting section 27 are neglected until 5 min. elapses. After the elapse of 5 min., an effective torque obtained by the effective torque detecting section 27 is treated as an effective one by the first-order lag filter section 35.

Furthermore, it may be considered additionally whether or not at least 30 min. has elapsed since a last halt until a current start-up. That is, with the mounting apparatus in operation, and with the drive units 38, 39, 40, 41 continuously driven, when the drive units 38, 39, 40, 41, after once halted due to some trouble, are started up again after a time elapse of less than 30 min., the drive units 38, 39, 40, 41 may hold a temperature-increased state in some cases. In such a case, it may be preferable not that effective torques obtained by the effective torque detecting section 27 are neglected by the first-order lag filter section 35 until 5 min. elapses, but that an effective torque is treated as an effective one by the first-order lag filter section 35 even if 5 min. has not elapsed. Therefore, processing flow may also be performed in the following manner. That is, prior to step S1, it is decided by the first-order lag filter section 35 whether or not at least 30 min. has elapsed since the last halt until the current start-up. Then, if at least 30 min. has elapsed, step S1 is executed, while if at least 30 min. has not elapsed, the processing flow may jump to step S2 in FIG. 8 (step S29 in FIG. 2) without executing step S1.

Further, a detection error eliminating operation as shown in step S2 and following in FIG. 8 may be executed by the first-order lag filter section 35. In the following example, it is assumed that counters C1 and C2 are provided for each of the drive units 10, 14, 23, 24.

That is, at step S2, it is decided by the first-order lag filter section 35 (or effective torque deciding section 28) whether or not an effective torque of any one of the drive units 10, 14, 23, 24 has exceeded its specified upper-limit value (e.g., a value of 105% of the rated torque).

If the effective torque of any one of the drive units has exceeded its specified upper-limit value at step S2, then the counter C1 corresponding to the relevant drive unit is incremented by one at step S6, and thereafter it is decided at step S7 whether or not the counter C1 counts larger than 3. This means that when an excess of the effective torque over its specified upper-limit value is an unusual error temporarily caused for some reason, this error is eliminated. That is, more specifically, only when the excess of the effective torque over its specified upper-limit value has succeeded more than three times, the effective torque is treated as an effective one. This number of times, three times, is given above only as an example, and it may be given by an arbitrary number smaller than the number of times that causes the relevant drive unit to lead to a failure.

If the counter C1 counts not more than 3 at step S7, a timer is set to a period of detection period, for example, 1 sec. at step S10, and then it is decided at step S11 whether or not 1 sec. has elapsed, wherein only if 1 sec. has elapsed at step S11, the processing flow returns to step S2.

If the counter C1 is larger than 3 at step S7, the counter C2 corresponding to the drive unit that has exceeded the upper-limit value is cleared at step S8, and then it is decided at step S9 whether or not the counter C1 corresponding to the drive unit that has exceeded the upper-limit value counts larger than 30. If the counter C1 counts larger than 30 at step S9, the processing flow goes to processing step S30. If the counter C1 counts not more than 30 at step S9, the processing flow goes to step S10.

Meanwhile, if an effective torque of any one of the drive units 10, 14, 23, 24 is not more than its specified upper-limit value at step S2, then the counter C2 corresponding to the drive unit is incremented by one at step S3, and thereafter it is decided at step S4 whether or not the counter C2 counts larger than 3. This means that when a non-excess of the effective torque over its specified upper-limit value is an unusual error temporarily caused for some reason, this error is eliminated. That is, more specifically, only when the non-excess of the effective torque over its specified upper-limit value has succeeded more than three times, the effective torque is treated as an effective one. This number of times, three times, is given above only as an example, and it may be given by an arbitrary number smaller than the number of times that causes a relevant drive unit to lead to a failure.

If the counter C2 is larger than 3 at step S4, the counter C1 corresponding to the drive unit that has counted not more than the upper-limit value is cleared at step S5, and then the processing flow goes to step S10.

If the counter C2 counts not more than 3 at step S4, the processing flow returns to step S2.

Through these steps, in deciding as to whether or not the effective torque of any one of the drive units 10, 14, 23, 24 exceeds its specified upper-limit value, not that this decision is made for every one time of comparison results of effective torques relative to the upper-limit value, but that this decision can be made as an effective one only when the same results have succeeded to a plurality of times or a specified number of times, so that detection errors can be eliminated and a more accurate decision can be achieved. Accordingly, it never occurs that unnecessary deceleration operations are performed due to detection errors, and any unintentional deterioration of production efficiency can be prevented, so that unnecessary deterioration of productivity can be prevented reliably. On the other hand, a deceleration operation can be performed only when properly necessary, so that drive control of the drive units can be achieved appropriately.

In addition, this FIG. 8, without being limited to applications to the upper-limit value, may also be applied to the lower-limit value, which is the safety value, in the same manner, thereby eliminating a possibility that the drive units might be mis-driven due to detection errors even without sufficient temperature decrease, so that any unintentional deterioration of the production efficiency can be prevented and unnecessary deterioration of productivity can be prevented reliably. On the other hand, an acceleration operation can be performed only when properly necessary, so that drive control of the drive units can be achieved appropriately.

Further, in cases where the drive units 38, 39, 40, 41 are each composed of a servomotor and a drive control device, and where those are each composed of a motor controlled by an inverter and a drive control device, since temperature increase characteristics are empirically approximated to a case where the time constant T of the first-order lag filter section 35 is set to 100 sec., setting the time constant to 100 sec. allows further working effects to be produced.

(Third Embodiment)

Next, a mounting apparatus according to a third embodiment of the present invention is described with reference to FIG. 4.

Figure 4:
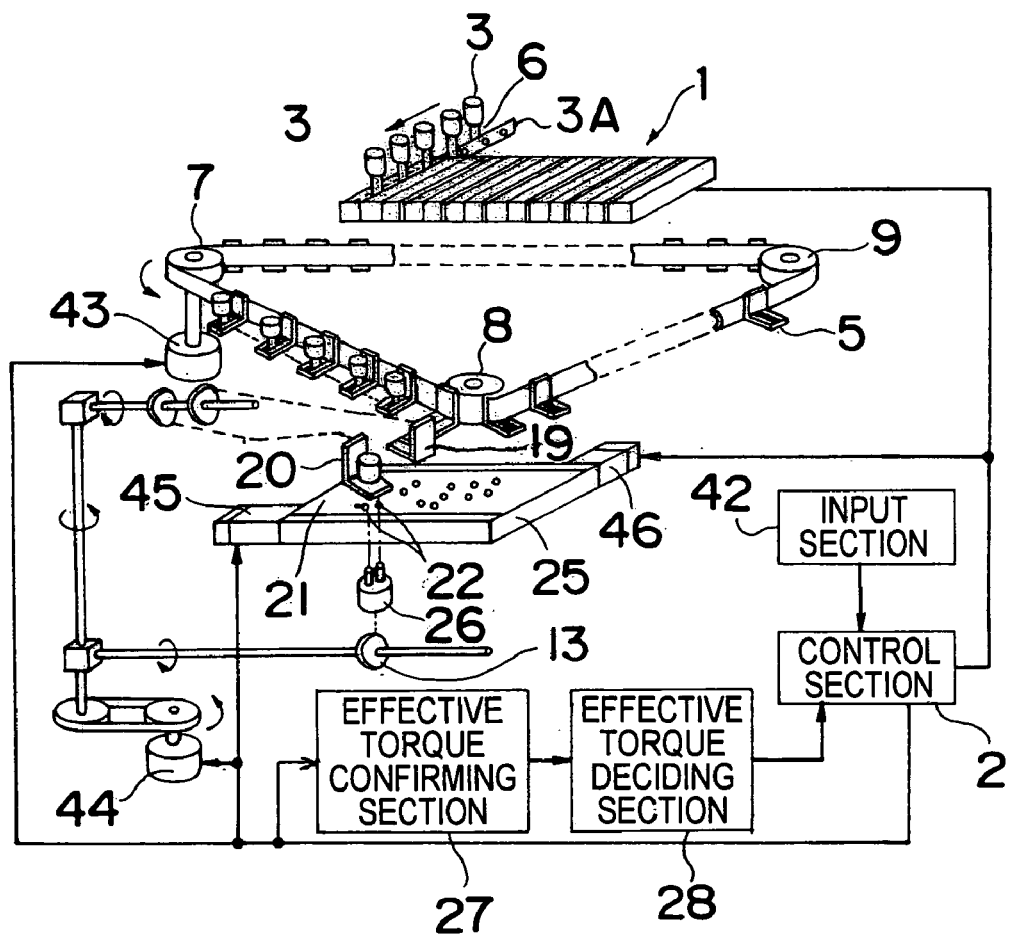
FIG. 4 a block diagram of a mounting apparatus according to a third embodiment of the present invention.

As shown in FIG. 4, in this embodiment, an input section 42 is added to the mounting apparatus of the foregoing first embodiment so that data input is enabled.

In this embodiment, when a deceleration of rotational speed is performed to a specified rotational speed when an effective torque of drive units 43, 44, 45, 46 has exceeded an upper-limit value, this embodiment is enabled to input the specified rotational speed via the input section 42.

This specified rotational speed is determined depending on use environment, machine structure (type of machine), a way of use of the drive units, and rotational speeds required for the drive units.

Accordingly, there is a need for setting specified rotational speeds for the drive units 43, 44, 45, 46, respectively, according to a place of use and a purpose of application.

This setting can be easily achieved by virtue of provision of the input section 42 even with presence of a plurality of drive units 43, 44, 45, 46.

In addition, when the input section 42 is implemented by an operation panel, it becomes possible to directly input specified rotational speeds, i.e., to perform input so as to change a deceleration speed value that is a specified safety value, a lower-limit value or upper-limit value of the counter C1 or C2 of the first-order filter section 35, and the like in consideration of use environment, machine type or characteristic, or the like, of course, in consideration of use environment, machine type or characteristic, or the like, it is possible to perform input so as to change the upper-limit value of the effective torque.

Further, when the input section 42 is implemented by a floppy disk, it is possible to input rotational speeds and the like.

Further, when the input section 42 is implemented by an interface which allows data to be inputted from a higher-order computer, it becomes possible similarly to input rotational speeds and the like from the higher-order computer.

In addition, a case is the same also when the input section 42 is provided in the second embodiment of the present invention.

According to this embodiment, the mounting apparatus comprises: an effective torque detecting section 27, 36 for detecting an effective torque required by at least one rotating-cam drive unit from among the plurality of drive units 10, 14, 23, 24 at an effective-torque detection cycle; an effective torque deciding section 28, 37 for deciding whether or not a detected effective torque has exceeded its upper-limit value, or whether or not the effective torque has been restored from an excess value to its safety value; a detection error eliminating means 35 for deciding whether or not the effective torque detected by the effective torque detecting section 27, 36 is a detection error, before a decision made by the effective torque deciding section 28, 37, to assign the effective torque, which has been decided as a non-detection error, to an object for a decision by the effective torque deciding section 28, 37; and a control section 2 for performing control of each of the electronic component feeding unit, the board holding section, the mounting section 20, the plurality of drive units, the effective torque detecting section 27, 36, the effective torque deciding section 28, 37, and the detection error eliminating means 35, wherein the control section 2 performs control operation so that if the detected effective torque has been decided by the detection error eliminating means 35 as a non-detection error, and moreover decided by the effective torque deciding section 28, 37 as having exceeded the upper-limit value, then an original rotational speed of the rotating-cam drive unit from which the effective torque has been detected is decreased to a specified deceleration speed of the relevant rotating-cam drive unit, and further if the effective torque of the rotating-cam drive unit detected by the effective torque detecting section 27, 36 has been decided by the effective torque deciding section 28, 37 as having lowered to not more than its safety value, the rotating-cam drive unit is restored again to the original rotational speed. As a result, it becomes possible to suppress temperature increases of the rotating-cam drive unit that would occur due to a decrease of the rotational speed of the rotating-cam drive unit to the specified deceleration speed when the effective torque, which is a non-detection error, has exceeded the upper-limit value. Thus, failures of the rotating-cam drive unit due to temperature increases can be prevented, thereby allowing an operation to go on without halting the machine. Further, when the effective torque has lowered to not more than a specified safety value, the rotational speed is restored again to the original rotational speed, thus making it possible for high-efficiency production to be performed without incurring failures of the rotating-cam drive unit and without unnecessarily halting the apparatus. Furthermore, by making a decision as to an upper limit of an effective torque that has been decided by the detection error eliminating means 35 as a non-detection error, it becomes possible to eliminate any detection error and make a decision in accordance with a temperature increase curve of the rotating-cam drive unit, thus making it possible, for example, to lower a frequency of rotational-speed deceleration for the rotating-cam drive unit immediately after start-up of the drive unit.

It is noted here that a significance of applying this embodiment to the rotating-cam drive unit is as follows. Under a condition that, on the board 21, a distance between a current-time mounting position, where one component has been inserted and mounted, and a next component mounting position is so large that a large movement amount of the board 21 by the X-Y table 25 is involved in driving the X-Y table 25 until a next component mounting position comes to be positioned under the mounting section 20, it is necessary to temporarily halt drive of the rotating-cam drive unit until movement of the X-Y table 25 is halted. When the drive is resumed several seconds after this halting, much load does not act on the rotating-cam drive unit. However, when the drive is resumed 1 to 2 seconds thereafter, large load acts on the rotating-cam drive unit such that a load causing the effective torque to go over 105% is liable to be applied. Such a state, if continued more than a permissible number of successive overload operations, e.g. about 30 times, would cause the rotating-cam drive unit to incur considerable heat generation, resulting in a failure such as a halt or runaway of the drive of the rotating-cam drive unit. To preliminarily prevent this, when the permissible number of successive overload operations has been reached, further continued overload operation afterwards is prohibited, and an operation mode is forcedly switched to a light-load state operation. By doing so, such failures are prevented while a complete halt of operation is prevented so that a necessary minimum production efficiency is maintained.

It is noted that the present invention is not limited to the above embodiments, and may further be embodied in other various ways.

For instance, although the present invention has been described above about those drive units 10, 14, 23, 24, yet the present invention may be applied to at least one drive unit, for example, the rotating-cam drive unit 14 at least.

Figure 15:
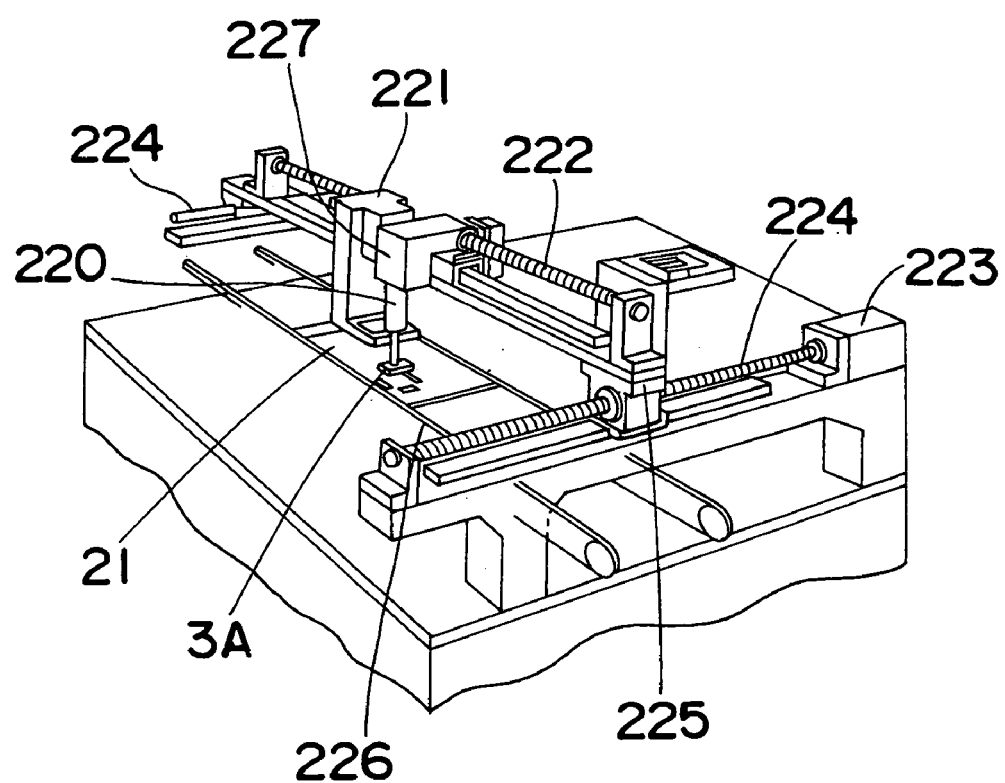
FIG. 15 is a perspective view of an X-Y orthogonal type mounting apparatus according to a fourth embodiment of the present invention.
Figure 16:
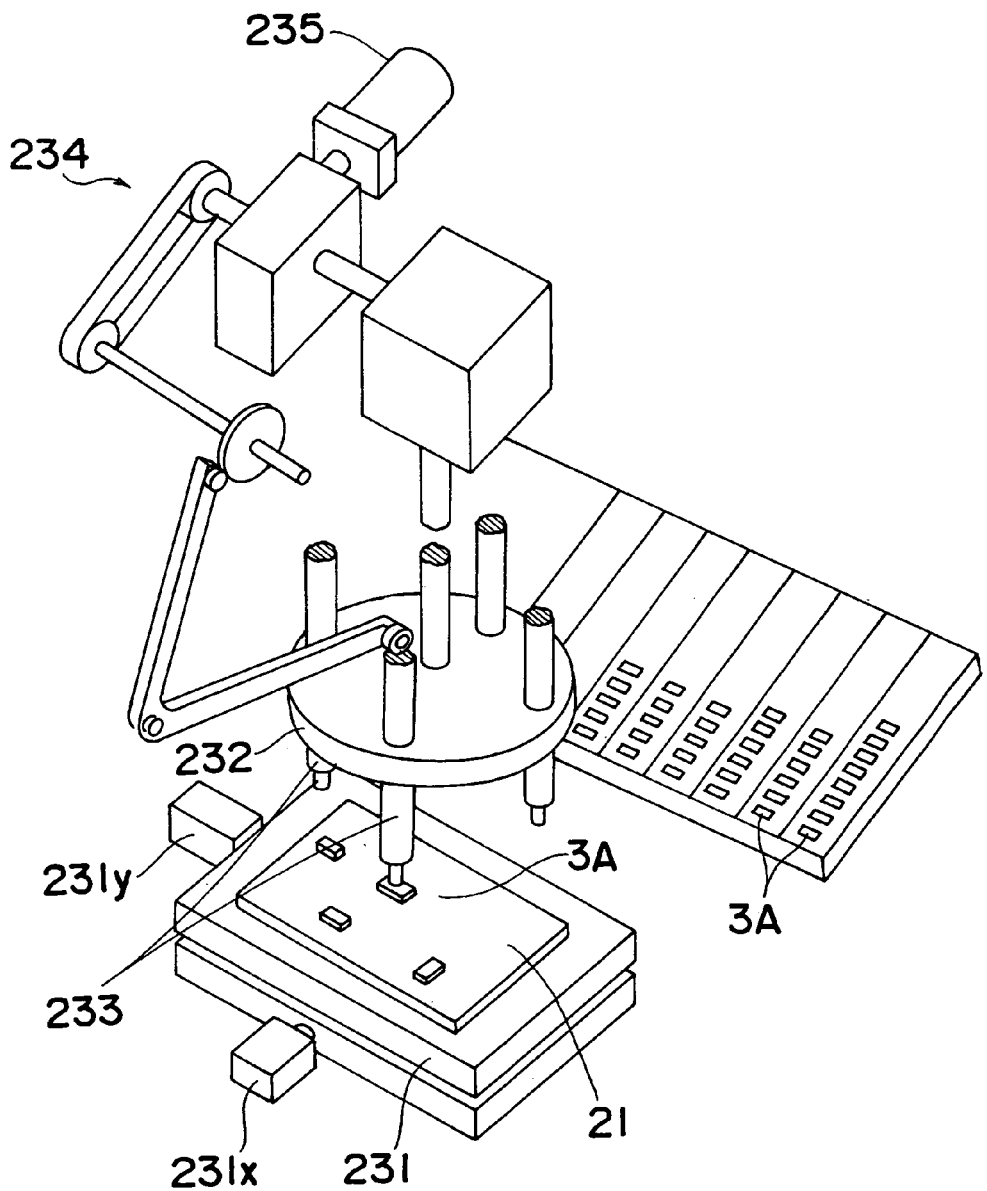
FIG. 16 is a perspective view of a rotary type mounting apparatus according to a fifth embodiment of the present invention.

Also, the present invention may be applied not only to such a mounting apparatus shown in FIG. 1 but also to such mounting apparatuses of other types as shown in FIGS. 15 and 16.

For instance, FIG. 15 is a perspective view of an X-Y orthogonal type mounting apparatus according to a fourth embodiment of the present invention. This X-Y orthogonal type mounting apparatus comprises: a board holding section 226 composed of a pair of rails for holding a board 21; an X-axis direction drive unit 223 composed of a pair of motors for driving a pair of X-axis direction screw shafts 224 in synchronous rotation to parallelly move a Y-axis drive member 225 along an X axis; a Y-axis direction drive unit 221 implemented by a self-propelled motor or the like for a Y-axis direction screw shaft 222 fixed to the Y-axis drive member 225; and a mounting section 220 implemented by a suction nozzle held on the Y-axis direction drive unit 221, wherein a component 3A fed from a component feed cassette or tray or the like is sucked and held by the mounting section 220 and mounted onto the board 21. In the X-Y orthogonal type mounting apparatus as shown above, the present invention may be applied to any one of the X-axis direction drive unit 223, the Y-axis direction drive unit 221, and an up-down drive device such as an up-down drive motor and the like for moving up and down the nozzle of the mounting section 220.

FIG. 16 is a perspective view of a rotary type mounting apparatus according to a fifth embodiment of the present invention. This rotary type mounting apparatus comprises: an X-Y table 231 having an X-direction drive unit 231x and a Y-direction drive unit 231y; a multiplicity of component suction nozzles 233 constituting a mounting section; a rotating member 232 on which the multiplicity of component suction nozzles 233 is arranged circumferentially; a rotating-member drive unit 235 implemented by a motor or the like for intermittently driving the rotating member 232 into rotation; and a transfer mechanism 234 for transferring a rotational force of the rotating-member drive unit 235 to the rotating member 232, and moreover moving up and down the component suction nozzles 233 at component mounting positions, wherein respective component suction nozzles 233 are positioned to at least component sucking positions and component mounting positions for the board 21 by intermittent rotation of the rotating member 232, where component suction and component mounting are performed. In such a rotary type mounting apparatus, the present invention may be applied to any one of the X-direction drive unit 231x, the Y-direction drive unit 231y, and the rotating-member drive unit 235.

Furthermore, combining any arbitrary embodiments together appropriately from among the foregoing various embodiments allows their respective effects to be produced.

According to the present invention, the mounting apparatus comprises: an effective torque detecting section for detecting an effective torque required by at least one drive unit from among a plurality of drive units at an effective-torque detection cycle; an effective torque deciding section for deciding whether or not a detected effective torque has exceeded its upper-limit value, or whether or not the effective torque has been restored from an excess state to its safety value; a detection error eliminating means for deciding whether or not the effective torque detected by the effective torque detecting section is a detection error, before a decision made by the effective torque deciding section to assign the effective torque, which has been decided as a non-detection error, to an object for a decision by the effective torque deciding section; and a control section for performing control of each of an electronic component feeding unit, a board holding section, a mounting section, the plurality of drive units, the effective torque detecting section, the effective torque deciding section, and the detection error eliminating means, wherein the control section performs control operation so that if the detected effective torque has been decided by the detection error eliminating means as a non-detection error and moreover decided by the effective torque deciding section as having exceeded the upper-limit value, then an original rotational speed of a drive unit from which the effective torque has been detected is decreased to a specified deceleration speed of the drive unit, and if the effective torque of the drive unit detected by the effective torque detecting section has lowered to not more than its safety value, the drive unit is restored again to an original rotational speed. As a result of this, it becomes possible to suppress temperature increases of the drive unit that would occur due to a decrease of the rotational speed of the drive unit to the specified deceleration speed when the effective torque, which is a non-detection error, has exceeded the upper-limit value. Thus, failures of the drive unit due to temperature increases can be prevented, thereby allowing operation to go on without halting the apparatus. Further, when the effective torque has lowered to not more than a specified safety value, the rotational speed is restored again to the original rotational speed, thus making it possible for high-efficiency production to be performed without incurring failures of the drive unit and without unnecessarily halting the apparatus. Furthermore, by making a decision as to the upper limit of an effective torque after processing by the detection error eliminating means, it becomes possible to eliminate any detection error and make a decision in accordance with a temperature increase curve of the drive unit, thus making it possible, for example, to lower a frequency of rotational-speed deceleration for the drive unit immediately after start-up of the drive unit.

The invention described in a second aspect of the present invention is a mounting apparatus defined in the first aspect, wherein each of the electronic components is an electronic component having lead wires. In a mounting apparatus for mounting electronic components equipped with leads, it becomes possible to suppress temperature increases of the drive unit that would occur due to excess of the effective torque over the specified upper-limit value. Thus, failures of the drive unit due to temperature increases can be prevented, thereby allowing an operation to go on without halting the apparatus.

The invention described in a third aspect of the present invention is a mounting apparatus as defined in the first or second aspect, wherein the electronic component feeding unit comprises: an electronic component feed section for storing therein a multiplicity of electronic components and feeding the electronic components independently of one another; a plurality of conveyor members for taking out fed electronic components and then conveying the electronic components to the mounting section; and a conveying section for moving the plurality of conveying members as the conveyor members are arranged in a stringed annular shape (i.e. in an interconnected peripheral arrangement). By these plurality of conveyor members and the conveying section, in the mounting apparatus in which the components are conveyed, it becomes possible to suppress temperature increases of the drive unit that would occur due to excess of the effective torque over the specified upper-limit value. Thus, failures of the drive unit due to temperature increases can be prevented, thereby allowing an operation to continue without halting the apparatus.

The invention described in a fourth aspect of the present invention is a mounting apparatus as defined in any one of the first to third aspects, wherein the upper-limit value of the effective torque in the effective torque deciding section is set to 105% of a rated torque of the drive unit. By the upper limit set to 105% of the rated torque, it becomes possible to suppress temperature increases of the drive unit even with the load varied more or less.

The invention described in a fifth aspect of the present invention is a mounting apparatus as defined in any one of the first to fourth aspects, wherein in the effective torque deciding section, the safety value of the effective torque that allows the drive unit to be restored to the original rotational speed is set to 95% of the rated torque of the drive unit. By the safety value set to 95% of the rated torque of the drive unit, it becomes possible to suppress a decrease of the rotational speed of the drive unit to a minimum.

The invention described in a sixth aspect of the present invention is a mounting apparatus as defined in any one of the first to fifth aspects, wherein a detection period of the effective torque detecting section for detection of the effective torque required in a specified unit time of the drive unit is set to not more than 1 sec. By the detection period set to not more than 1 sec., it becomes possible to detect the effective torque also when an abrupt load change has occurred.

The invention described in a seventh aspect of the present invention is a mounting apparatus as defined in any one of the first to sixth aspects, wherein the control section performs control so that if the effective torque does not become lower than the specified upper-limit value even if the rotational speed of the drive unit is decreased, the drive unit is halted. Thus, it becomes possible to suppress damage of the machine to a minimum even when the drive unit has incurred a mechanically non-rotatable state.

The invention described in an eighth aspect of the present invention is a mounting apparatus as defined in any one of the first to seventh aspects, wherein the drive unit comprises a servomotor and a drive control device for controlling drive of the servomotor. By the drive unit comprising the servomotor and the drive control device, it becomes possible to perform high-speed, high-precision positional control.

The invention described in a ninth aspect of the present invention is a mounting apparatus as defined in any one of the first to seventh aspects, wherein the drive unit comprises a motor controlled by an inverter and a drive control device for controlling drive of the motor. By the drive unit comprising an inverter-controlled motor and the drive control device, it becomes possible to perform positional control with simplicity and low cost.

The invention described in a tenth aspect of the present invention is a mounting apparatus as defined in any one of the first to seventh aspects, wherein the drive unit comprises a stepping motor and a drive control device for controlling drive of the stepping motor. By the drive unit comprising a stepping motor and a drive control device, it becomes possible to perform positional control with low cost and simplicity.

The invention described in an eleventh aspect of the present invention is a mounting apparatus as defined in the tenth aspect, wherein a time constant of the detection error eliminating means is set to 100 sec. By setting to 100 sec., it becomes possible to detect the effective torque approximate to an actual temperature increase curve of the drive unit.

The invention described in a twelfth aspect of the present invention is a mounting apparatus as defined in any one of the first to eleventh aspects, further comprising an input section by which a set value of the deceleration speed for the rotational speed of the drive unit in a deceleration operation can be inputted from external of the mounting apparatus. Thus, the set value of the deceleration speed can be easily changed when a load is changed.

The invention described in a thirteenth aspect of the present invention is a mounting apparatus as defined in the twelfth aspect, wherein the input section is an operation panel. Thus, it becomes possible to determine a rotational speed while the apparatus is being adjusted.

The invention described in a fourteenth aspect of the present invention is a mounting apparatus as defined in the twelfth aspect, wherein the input section is a floppy disk drive. When a multiplicity of similar mounting apparatuses is used, it becomes possible to set the rotational speed without errors even if an operator has no knowledge as to a rotational-speed setting.

The invention described in a fifteenth aspect of the present invention is a mounting apparatus as defined in the twelfth aspect, wherein the input section is an interface which allows data to be inputted from a higher-order computer. Thus, it becomes possible to collectively manage rotational-speed set values by the higher-order computer.

The mounting apparatus described in sixteenth and seventeenth aspects of the present invention is a mounting apparatus as defined in any one of the first to fifteenth aspects, wherein in a case where the effective torque detected by the effective torque detecting section is decided by the effective torque deciding section as having exceeded the upper-limit value, or as being not more than the upper-limit value, the detection error eliminating means decides that the effective torque detected by the effective torque detecting section is a non-detection error only when the same decision result has succeeded to a specified number of times, and the detection error eliminating means decides that the effective torque detected by the effective torque detecting section is a detection error, when the same decision result does not succeed to the specified number of times. In this case, it becomes possible to eliminate detection errors with reliability, thereby allowing required operations to be performed as truly required.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:
1. A mounting apparatus comprising:
an electronic component feeding unit for feeding a electronic components;
a board holding section for holding a circuit board, onto which the electronic components are to be mounted, and being capable of moving the circuit board in two orthogonal directions along a mounting surface;
a mounting section for mounting the electronic components, fed from said electronic component feeding unit, onto the circuit board when held by said board holding section;
drive units for driving said electronic component feeding unit, said board holding section, and said mounting section, respectively;
an effective torque detecting section for detecting an effective torque required by at least one of said drive units at an effective-torque detection cycle;
an effective torque deciding section for deciding whether or not the effective torque as detected by said effective torque detecting section has exceeded an upper-limit value, or whether or not the effective torque as detected by said effective torque detecting section has been restored from an excess value to a safety value;
a detection error eliminating means for deciding whether or not the effective torque as detected by said effective torque detecting section is a detection error, before a decision is made by said effective torque deciding section to assign the effective torque, after having been decided by said error eliminating means to be a non-detection error, to an object for a decision to be made by said effective torque deciding section; and
a control section for performing control of said electronic component feeding unit, said board holding section, said mounting section, said drive units, said effective torque detecting section, said effective torque deciding section, and said detection error eliminating means, such that
(i) if the effective torque as detected by said effective torque detecting section has been decided by said detection error eliminating means to be a non-detection error and decided by said effective torque deciding section as having exceeded the upper-limit value, then an original rotational speed of said at least one drive unit is decreased to a specified speed of said at least one drive unit, and

(ii) if the effective torque as detected by said effective torque detecting section has been determined to have lowered to not more than the safety value, then said at least one drive unit is restored to the original rotational speed.

2. The mounting apparatus according to claim 1, wherein said effective torque detecting section is capable of detecting the effective torque required by at least one of said drive units by detecting a torque, having a value corresponding to a value of the effective torque, for not more than one second.

3. The mounting apparatus according to claim 2, wherein said control section is for also performing control such that if the effective torque as detected by said effective torque detecting section does not become lower than the upper-limit value, regardless of whether said at least one drive unit is decelerated, said at least one drive unit is halted.

4. The mounting apparatus according to claim 3, further comprising:
an input section by which a set value of the specified speed can be inputted from external of the mounting apparatus.

5. The mounting apparatus according to claim 4, wherein said input section comprises an operation panel.

6. The mounting apparatus according to claim 4, wherein said input section comprises a floppy disk drive.

7. The mounting apparatus according to claim 4, wherein said input section comprises an interface which allows data to be inputted from a higher-order computer.

8. The mounting apparatus according to claim 3, wherein said at least one drive unit comprises a servomotor and a drive control device for controlling drive of said servomotor.

9. The mounting apparatus according to claim 3, wherein said at least one drive unit comprises a motor controlled by an inverter, and a drive control device for controlling drive of said motor.

10. The mounting apparatus according to claim 3, wherein said at least one drive unit comprises a stepping motor and a drive control device for controlling drive of said stepping motor.

11. The mounting apparatus according to claim 3, wherein said detection error eliminating means has a time constant of one hundred seconds.

12. The mounting apparatus according to claim 1, wherein said effective torque deciding section is for deciding whether or not the effective torque as detected by said effective torque detecting section has exceeded an upper-limit value by deciding whether or not the effective torque has exceeded a value that is 105% of a rated torque of said at least one drive unit corresponding to a permissible number of successive overload operations in continuously performing an overload operation in which said at least one drive unit is decelerated, halted, and then immediately accelerated.

13. The mounting apparatus according to claim 12, wherein
said control section is for performing control such that said at least one drive unit is restored to the original rotational speed, if the effective torque as detected by said effective torque detecting section has been determined to have lowered to not more than the safety value, by performing control such that said at least one drive unit is restored to the original rotational speed if the effective torque as detected by said effective torque detecting section has been determined to have lowered to not more than 95% of the rated torque of said at least one drive unit.

14. The mounting apparatus according to claim 12, wherein
said effective torque detecting section is capable of detecting the effective torque required by at least one of said drive units by detecting a torque, having a value corresponding to a value of the effective torque, for not more than one second.

15. The mounting apparatus according to claim 1, wherein
said electronic component feeding unit for feeding electronic components comprises an electronic component feeding unit for feeding electronic components each having a lead wire.

16. The mounting apparatus according to claim 15, wherein
said effective torque detecting section is capable of detecting the effective torque required by at least one of said drive units by detecting a torque, having a value corresponding to a value of the effective torque, for not more than one second.

17. The mounting apparatus according to claim 1, wherein said electronic component feeding unit comprises
(i) an electronic component feed section for storing therein a multiplicity of the electronic components, and feeding the electronic components of the multiplicity independently of one another,
(ii) conveyor members for removing fed electronic components of the multiplicity and conveying these electronic components to said mounting section, said conveyor members defining an interconnected peripheral arrangement, and
(iii) a conveying section for moving said interconnected peripheral arrangement.

18. The mounting apparatus according to claim 17, wherein
said effective torque detecting section is capable of detecting the effective torque required by at least one of said drive units by detecting a torque, having a value corresponding to a value of the effective torque, for not more than one second.

19. The mounting apparatus according to claim 1, wherein
said control section is also for performing control such that if the effective torque as detected by said effective torque detecting section is decided by said effective torque deciding section, as a decision result, as having exceeded the upper-limit value, then
(i) said detection error eliminating means decides that the effective torque is a non-detection error only when this decision result has succeeded to a specified number of times, and
(ii) said detection error eliminating means decides that the effective torque is a detection error, and neglects the effective torque, when this decision result does not succeed to the specified number of times.

20. The mounting apparatus according to claim 19, wherein
said control section is also for performing control such that if the effective torque as detected by said effective torque detecting section is decided by said effective torque deciding section, as a decision result, as being not more than the upper-limit value, then
(i) said detection error eliminating means decides that the effective torque is a non-detection error only when this decision result has succeeded to a specified number of times, and (ii) said detection error eliminating means decides that the effective torque is a detection error, and neglects the effective torque, when this decision result does not succeed to the specified number of times.

21. The mounting apparatus according to claim 1, wherein said control section is also for performing control such that if the effective torque as detected by said effective torque detecting section is decided by said effective torque deciding section, as a decision result, as being not more than the upper-limit value, then
    (i) said detection error eliminating means decides that the effective torque is a non-detection error only when this decision result has succeeded to a specified number of times, and
    (ii) said detection error eliminating means decides that the effective torque is a detection error, and neglects the effective torque, when this decision result does not succeed to the specified number of times.

22. A mounting apparatus comprising:
an electronic component feeding unit for feeding electronic components;
a board holding section for holding a circuit board onto which the electronic components are to be mounted;
a mounting section capable in moving in two orthogonal directions along a mounting surface for mounting electronic components, fed from said electronic component feeding unit, onto the circuit board when held by said board holding section;
drive units for driving said mounting section;
an effective torque detecting section for detecting an effective torque required by at least one of said drive units at an effective-torque detection cycle;
an effective torque deciding section for deciding whether or not the effective torque as detected by said effective torque detecting section has exceeded an upper-limit value, or whether or not the effective torque as detected by said effective torque detecting section has been restored from an excess value to a safety value;
a detection error eliminating means for deciding whether or not the effective torque as detected by said effective torque detecting section is a detection error, before a decision is made by said effective torque deciding section to assign the effective torque, after having been decided by said detection error eliminating means to be a non-detection error, to an object for a decision to be made by said effective torque deciding section; and
a control section for performing control of said electronic component feeding unit, said board holding section, said mounting section, said drive units, said effective torque detecting section, said effective torque deciding section, and said detection error eliminating means, such that
    (i) if the effective torque as detected by said effective torque detecting section has been decided by said detection error eliminating means to be a non-detection error and decided by said effective torque deciding section as having exceeded the upper-limit value, then an original rotational speed of said at least one drive unit is decreased to a specified speed of said at least one drive unit, and
    (ii) if the effective torque as detected by said effective torque detecting section has been determined to have lowered to not more than the safety value, then said at least one drive unit is restored to the original rotational speed.

* * * * *